US009549258B2

(12) United States Patent
Ramos et al.

(10) Patent No.: US 9,549,258 B2
(45) Date of Patent: *Jan. 17, 2017

(54) AUDIO OUTPUT BALANCING

(71) Applicant: Sonos, Inc., Santa Barbara, CA (US)

(72) Inventors: Aurelio Rafael Ramos, Jamaica Plain, MA (US); Timothy W. Sheen, Brighton, MA (US)

(73) Assignee: Sonos, Inc., Santa Barbara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/134,767

(22) Filed: Apr. 21, 2016

(65) Prior Publication Data

US 2016/0234598 A1 Aug. 11, 2016

Related U.S. Application Data

(63) Continuation of application No. 14/937,523, filed on Nov. 10, 2015, now Pat. No. 9,363,601, which is a (Continued)

(51) Int. Cl.
*H04R 5/02* (2006.01)
*H04R 3/14* (2006.01)
(Continued)

(52) U.S. Cl.
CPC .............. *H04R 3/14* (2013.01); *H03G 3/001* (2013.01); *H03G 3/20* (2013.01); *H03G 11/008* (2013.01);
(Continued)

(58) Field of Classification Search
CPC .......... H04S 7/307; H04S 1/007; H03G 7/002; H03G 3/001; H04R 3/04; H04R 3/14; H04R 11/00; H04R 27/00; H04R 5/04; H04R 2430/01; H04R 2227/005; H04R 2430/03; H04R 2227/003

See application file for complete search history.

(56) References Cited

U.S. PATENT DOCUMENTS 3,956,591 A 5/1976 Gates, Jr.
4,105,974 A 8/1978 Rogers
(Continued)

FOREIGN PATENT DOCUMENTS

CA 2320451 A1 3/2001
CN 1598767 A 3/2005
(Continued)

OTHER PUBLICATIONS

Advisory Action mailed on Oct. 5, 2015, issued in connection with U.S. Appl. No. 13/458,558, filed Apr. 27, 2012, 4 pages.
(Continued)

*Primary Examiner* — Muhammad N Edun
(74) *Attorney, Agent, or Firm* — McDonnell Boehnen Hulbert & Berghoff LLP

(57) ABSTRACT

An example implementation involves a first playback device receiving audio content to be played back by the first playback device and a second playback device in synchrony. Such audio content may include a first and second stereo component. The first playback device determines a limiting result that indicates frequencies at which a playback volume of the second playback device is limited and determines a crossover frequency based on the indicated frequencies at which the playback volume of the second playback device is limited. The first playback device causes the second playback device to play a first portion of the second stereo component that is above the determined crossover frequency and plays (i) the first stereo component and (ii) a second portion of the second stereo component that is below the (Continued)

indicated frequency in synchrony with playback of the first portion by the second playback device.

20 Claims, 13 Drawing Sheets

Related U.S. Application Data continuation of application No. 14/174,253, filed on Feb. 6, 2014, now Pat. No. 9,226,073.

(51) Int. Cl.
| | |
|---|---|
| *H04R 3/04* | (2006.01) |
| *H04R 11/00* | (2006.01) |
| *H03G 3/00* | (2006.01) |
| *H04R 27/00* | (2006.01) |
| *H04R 3/12* | (2006.01) |
| *H03G 3/20* | (2006.01) |
| *H04R 5/04* | (2006.01) |
| *H03G 11/00* | (2006.01) |
| *H04S 7/00* | (2006.01) |

(52) U.S. Cl.
CPC ........ *H04R 3/04* (2013.01); *H04R 3/12* (2013.01); *H04R 5/04* (2013.01); *H04R 11/00* (2013.01); *H04R 27/00* (2013.01); *H04S 7/307* (2013.01); *H04R 2227/005* (2013.01); *H04R 2430/03* (2013.01); *H04S 2400/03* (2013.01)

(56) References Cited

U.S. PATENT DOCUMENTS

| | | |
|---|---|---|
| D260,764 S | 9/1981 | Castagna et al. |
| 4,306,114 A | 12/1981 | Callahan |
| 4,382,158 A | 5/1983 | Ohshita et al. |
| 4,509,211 A | 4/1985 | Robbins |
| D279,779 S | 7/1985 | Taylor |
| 4,530,091 A | 7/1985 | Crockett |
| 4,701,629 A | 10/1987 | Citroen |
| D293,671 S | 1/1988 | Beaumont |
| 4,731,814 A | 3/1988 | Becker et al. |
| 4,824,059 A | 4/1989 | Butler |
| D301,037 S | 5/1989 | Matsuda |
| 4,845,751 A | 7/1989 | Schwab |
| D304,443 S | 11/1989 | Grinyer et al. |
| D313,023 S | 12/1990 | Kolenda et al. |
| D313,398 S | 1/1991 | Gilchrist |
| D313,600 S | 1/1991 | Weber |
| 4,994,908 A | 2/1991 | Kuban et al. |
| 4,995,778 A | 2/1991 | Brussel |
| D320,598 S | 10/1991 | Auerbach et al. |
| D322,609 S | 12/1991 | Patton |
| 5,086,385 A | 2/1992 | Launey et al. |
| D326,450 S | 5/1992 | Watanabe |
| D327,060 S | 6/1992 | Wachob et al. |
| 5,151,922 A | 9/1992 | Weiss |
| D331,388 S | 12/1992 | Dahnert et al. |
| 5,182,552 A | 1/1993 | Paynting |
| D333,135 S | 2/1993 | Wachob et al. |
| 5,237,327 A | 8/1993 | Saitoh et al. |
| 5,272,757 A | 12/1993 | Scofield et al. |
| D350,531 S | 9/1994 | Tsuji |
| D350,962 S | 9/1994 | Reardon et al. |
| 5,361,381 A | 11/1994 | Short |
| 5,372,441 A | 12/1994 | Louis |
| D354,059 S | 1/1995 | Hendricks |
| D354,751 S | 1/1995 | Hersh et al. |
| D356,093 S | 3/1995 | McCauley et al. |
| D356,312 S | 3/1995 | Althans |
| D357,024 S | 4/1995 | Tokiyama et al. |
| 5,406,634 A | 4/1995 | Anderson et al. |
| 5,430,485 A | 7/1995 | Lankford et al. |
| 5,440,644 A | 8/1995 | Farinelli et al. |
| D362,446 S | 9/1995 | Gasiorek et al. |
| 5,457,448 A | 10/1995 | Totsuka et al. |
| D363,933 S | 11/1995 | Starck |
| D364,877 S | 12/1995 | Tokiyama et al. |
| D364,878 S | 12/1995 | Green et al. |
| D365,102 S | 12/1995 | Gioscia |
| D366,044 S | 1/1996 | Hara et al. |
| 5,481,251 A | 1/1996 | Buys et al. |
| 5,515,345 A | 5/1996 | Barreira et al. |
| 5,519,641 A | 5/1996 | Beers et al. |
| D372,716 S | 8/1996 | Thorne |
| 5,553,147 A | 9/1996 | Pineau |
| 5,553,314 A | 9/1996 | Grube et al. |
| D377,651 S | 1/1997 | Biasotti et al. |
| 5,625,350 A | 4/1997 | Fukatsu et al. |
| D379,816 S | 6/1997 | Laituri et al. |
| 5,640,388 A | 6/1997 | Woodhead et al. |
| D380,752 S | 7/1997 | Hanson |
| D382,271 S | 8/1997 | Akwiwu |
| 5,661,665 A | 8/1997 | Glass et al. |
| 5,668,884 A | 9/1997 | Clair, Jr. et al. |
| 5,673,323 A | 9/1997 | Schotz et al. |
| D384,940 S | 10/1997 | Kono et al. |
| D387,352 S | 12/1997 | Kaneko et al. |
| D388,792 S | 1/1998 | Nykerk |
| D389,143 S | 1/1998 | Wicks |
| D392,641 S | 3/1998 | Fenner |
| D393,628 S | 4/1998 | Ledbetter et al. |
| 5,740,235 A | 4/1998 | Lester et al. |
| 5,742,623 A | 4/1998 | Nuber et al. |
| D394,659 S | 5/1998 | Biasotti et al. |
| 5,761,320 A | 6/1998 | Farinelli et al. |
| 5,774,016 A | 6/1998 | Ketterer |
| D395,889 S | 7/1998 | Gerba et al. |
| 5,790,543 A | 8/1998 | Cloutier |
| D397,996 S | 9/1998 | Smith |
| 5,812,201 A | 9/1998 | Yoo |
| 5,818,948 A | 10/1998 | Gulick |
| D401,587 S | 11/1998 | Rudolph |
| 5,832,024 A | 11/1998 | Schotz et al. |
| 5,848,152 A | 12/1998 | Slipy et al. |
| 5,852,722 A | 12/1998 | Hamilton |
| D404,741 S | 1/1999 | Schumaker et al. |
| D405,071 S | 2/1999 | Gambaro |
| 5,875,233 A | 2/1999 | Cox |
| D406,847 S | 3/1999 | Gerba et al. |
| D407,071 S | 3/1999 | Keating |
| 5,905,768 A | 5/1999 | Maturi et al. |
| D410,927 S | 6/1999 | Yamagishi |
| 5,910,991 A | 6/1999 | Farrar |
| D412,337 S | 7/1999 | Hamano |
| 5,923,902 A | 7/1999 | Inagaki |
| 5,946,343 A | 8/1999 | Schotz et al. |
| 5,956,025 A | 9/1999 | Goulden et al. |
| 5,960,006 A | 9/1999 | Maturi et al. |
| D415,496 S | 10/1999 | Gerba et al. |
| D416,021 S | 11/1999 | Godette et al. |
| 5,984,512 A | 11/1999 | Jones et al. |
| 5,987,611 A | 11/1999 | Freund |
| 5,990,884 A | 11/1999 | Douma et al. |
| 5,991,307 A | 11/1999 | Komuro et al. |
| 5,999,906 A | 12/1999 | Mercs et al. |
| 6,018,376 A | 1/2000 | Nakatani |
| D420,006 S | 2/2000 | Tonino |
| 6,029,196 A | 2/2000 | Lenz |
| 6,038,614 A | 3/2000 | Chan et al. |
| 6,046,550 A | 4/2000 | Ference et al. |
| 6,061,457 A | 5/2000 | Stockhamer |
| 6,081,266 A | 6/2000 | Sciammarella |
| 6,088,063 A | 7/2000 | Shiba |
| D429,246 S | 8/2000 | Holma |
| D430,143 S | 8/2000 | Renk |
| 6,101,195 A | 8/2000 | Lyons et al. |
| D431,552 S | 10/2000 | Backs et al. |
| D432,525 S | 10/2000 | Beecroft |
| 6,127,941 A | 10/2000 | Van Ryzin |
| 6,148,205 A | 11/2000 | Cotton |
| 6,169,725 B1 | 1/2001 | Gibbs et al. |

(56) References Cited

U.S. PATENT DOCUMENTS

| | | |
|---|---|---|
| 6,181,383 B1 | 1/2001 | Fox et al. |
| 6,195,435 B1 | 2/2001 | Kitamura |
| 6,212,282 B1 | 4/2001 | Mershon |
| 6,246,701 B1 | 6/2001 | Slattery |
| D444,475 S | 7/2001 | Levey et al. |
| 6,256,554 B1 | 7/2001 | DiLorenzo |
| 6,269,406 B1 | 7/2001 | Dutcher et al. |
| 6,301,012 B1 | 10/2001 | White et al. |
| 6,310,652 B1 | 10/2001 | Li et al. |
| 6,313,879 B1 | 11/2001 | Kubo et al. |
| 6,321,252 B1 | 11/2001 | Bhola et al. |
| D452,520 S | 12/2001 | Gotham et al. |
| 6,353,172 B1 | 3/2002 | Fay et al. |
| 6,356,871 B1 | 3/2002 | Hemkumar et al. |
| 6,404,811 B1 | 6/2002 | Cvetko et al. |
| 6,418,150 B1 | 7/2002 | Staats |
| 6,442,443 B1 | 8/2002 | Fujii et al. |
| D462,339 S | 9/2002 | Allen et al. |
| D462,340 S | 9/2002 | Allen et al. |
| D462,945 S | 9/2002 | Skulley |
| 6,449,642 B2 | 9/2002 | Bourke-Dunphy et al. |
| 6,456,783 B1 | 9/2002 | Ando et al. |
| 6,463,474 B1 | 10/2002 | Fuh et al. |
| 6,466,832 B1 | 10/2002 | Zuqert et al. |
| 6,469,633 B1 | 10/2002 | Wachter |
| D466,108 S | 11/2002 | Glodava et al. |
| 6,487,296 B1 | 11/2002 | Allen et al. |
| 6,493,832 B1 | 12/2002 | Itakura et al. |
| D468,297 S | 1/2003 | Ikeda |
| 6,522,886 B1 | 2/2003 | Youngs et al. |
| 6,535,121 B2 | 3/2003 | Matheny |
| D474,763 S | 5/2003 | Tozaki et al. |
| D475,993 S | 6/2003 | Meyer |
| D476,643 S | 7/2003 | Yamagishi |
| D477,310 S | 7/2003 | Moransais |
| 6,587,127 B1 | 7/2003 | Leeke et al. |
| D478,051 S | 8/2003 | Sagawa |
| D478,069 S | 8/2003 | Beck et al. |
| D478,896 S | 8/2003 | Summers |
| 6,604,023 B1 | 8/2003 | Brown et al. |
| 6,611,537 B1 | 8/2003 | Edens et al. |
| D479,520 S | 9/2003 | De Saulles |
| D481,056 S | 10/2003 | Kawasaki et al. |
| 6,631,410 B1 | 10/2003 | Kowalski et al. |
| 6,636,269 B1 | 10/2003 | Baldwin |
| 6,653,899 B2 | 11/2003 | Organvidez et al. |
| 6,654,720 B1 | 11/2003 | Graham et al. |
| 6,654,956 B1 | 11/2003 | Trinh et al. |
| 6,684,060 B1 | 1/2004 | Curtin |
| D486,145 S | 2/2004 | Kaminski et al. |
| 6,704,421 B1 | 3/2004 | Kitamura |
| 6,741,961 B2 | 5/2004 | Lim |
| D491,925 S | 6/2004 | Griesau et al. |
| 6,757,517 B2 | 6/2004 | Chang |
| D493,148 S | 7/2004 | Shibata et al. |
| D495,333 S | 8/2004 | Borsboom |
| 6,778,073 B2 | 8/2004 | Lutter et al. |
| 6,778,869 B2 | 8/2004 | Champion |
| D496,003 S | 9/2004 | Spira |
| D496,005 S | 9/2004 | Wang |
| D496,335 S | 9/2004 | Spira |
| D497,363 S | 10/2004 | Olson et al. |
| D499,086 S | 11/2004 | Polito |
| 6,816,510 B1 | 11/2004 | Banerjee |
| 6,826,283 B1 | 11/2004 | Wheeler et al. |
| D499,395 S | 12/2004 | Hsu |
| D499,718 S | 12/2004 | Chen |
| D500,015 S | 12/2004 | Gubbe |
| D501,477 S | 2/2005 | Hall |
| 6,859,460 B1 | 2/2005 | Chen |
| 6,859,538 B1 | 2/2005 | Voltz |
| 6,873,862 B2 | 3/2005 | Reshefsky |
| D504,872 S | 5/2005 | Uehara et al. |
| D504,885 S | 5/2005 | Zhang et al. |
| 6,889,207 B2 | 5/2005 | Slemmer et al. |
| 6,901,439 B1 | 5/2005 | Bonasia et al. |
| D506,463 S | 6/2005 | Daniels |
| 6,915,347 B2 | 7/2005 | Hanko et al. |
| 6,916,980 B2 | 7/2005 | Ishida et al. |
| 6,919,771 B2 | 7/2005 | Nakajima |
| 6,931,134 B1 | 8/2005 | Waller, Jr. et al. |
| 6,931,557 B2 | 8/2005 | Togawa |
| 6,937,988 B1 | 8/2005 | Hemkumar et al. |
| 6,987,767 B2 | 1/2006 | Saito |
| 6,987,947 B2 | 1/2006 | Richenstein et al. |
| D515,072 S | 2/2006 | Lee |
| D515,557 S | 2/2006 | Okuley |
| D518,475 S | 4/2006 | Yang et al. |
| 7,046,677 B2 | 5/2006 | Monta et al. |
| D524,296 S | 7/2006 | Kita |
| 7,072,477 B1 | 7/2006 | Kincaid |
| D527,375 S | 8/2006 | Flora et al. |
| 7,092,528 B2 | 8/2006 | Patrick et al. |
| 7,092,694 B2 | 8/2006 | Griep et al. |
| 7,096,169 B2 | 8/2006 | Crutchfield et al. |
| 7,120,168 B2 | 10/2006 | Zimmermann |
| 7,130,316 B2 | 10/2006 | Kovacevic |
| 7,130,608 B2 | 10/2006 | Hollstrom et al. |
| 7,130,616 B2 | 10/2006 | Janik |
| 7,136,934 B2 | 11/2006 | Carter et al. |
| 7,139,981 B2 | 11/2006 | Mayer et al. |
| 7,143,939 B2 | 12/2006 | Henzerling |
| 7,146,260 B2 | 12/2006 | Preston et al. |
| 7,161,939 B2 | 1/2007 | Israel et al. |
| 7,171,010 B2 | 1/2007 | Martin et al. |
| 7,187,947 B1 | 3/2007 | White et al. |
| 7,197,148 B2 | 3/2007 | Nourse et al. |
| 7,206,618 B2 | 4/2007 | Latto et al. |
| 7,218,708 B2 | 5/2007 | Berezowski et al. |
| 7,236,773 B2 | 6/2007 | Thomas |
| 7,260,616 B1 | 8/2007 | Cook |
| 7,263,110 B2 | 8/2007 | Fujishiro |
| 7,277,547 B1 | 10/2007 | Delker et al. |
| 7,289,631 B2 | 10/2007 | Ishidoshiro |
| 7,295,548 B2 | 11/2007 | Blank et al. |
| 7,302,468 B2 | 11/2007 | Wijeratne |
| 7,305,694 B2 | 12/2007 | Commons et al. |
| 7,308,188 B2 | 12/2007 | Namatame |
| 7,324,857 B2 | 1/2008 | Goddard |
| 7,346,332 B2 | 3/2008 | McCarty et al. |
| 7,356,011 B1 | 4/2008 | Waters et al. |
| 7,366,206 B2 | 4/2008 | Lockridge et al. |
| 7,428,310 B2 | 9/2008 | Park |
| 7,430,181 B1 | 9/2008 | Hong |
| 7,457,948 B1 | 11/2008 | Bilicksa et al. |
| 7,472,058 B2 | 12/2008 | Tseng et al. |
| 7,483,538 B2 | 1/2009 | McCarty et al. |
| 7,490,044 B2 | 2/2009 | Kulkarni |
| 7,492,912 B2 | 2/2009 | Chung et al. |
| 7,505,889 B2 | 3/2009 | Salmonsen et al. |
| 7,519,188 B2 | 4/2009 | Berardi et al. |
| 7,539,551 B2 | 5/2009 | Komura et al. |
| 7,548,744 B2 | 6/2009 | Oesterling et al. |
| 7,548,851 B1 | 6/2009 | Lau et al. |
| 7,558,224 B1 | 7/2009 | Surazski et al. |
| 7,558,635 B1 | 7/2009 | Thiel et al. |
| 7,561,932 B1 | 7/2009 | Holmes et al. |
| 7,571,014 B1 | 8/2009 | Lambourne et al. |
| 7,626,952 B2 | 12/2009 | Slemmer et al. |
| 7,627,825 B2 | 12/2009 | Kakuda |
| 7,630,500 B1 | 12/2009 | Beckman et al. |
| 7,630,501 B2 | 12/2009 | Blank et al. |
| 7,643,894 B2 | 1/2010 | Braithwaite et al. |
| 7,653,344 B1 | 1/2010 | Feldman et al. |
| 7,657,910 B1 | 2/2010 | McAulay et al. |
| 7,668,990 B2 | 2/2010 | Krzyzanowski et al. |
| 7,675,943 B2 | 3/2010 | Mosig et al. |
| 7,676,044 B2 | 3/2010 | Sasaki et al. |
| 7,676,142 B1 | 3/2010 | Hung |
| 7,688,306 B2 | 3/2010 | Wehrenberg et al. |
| 7,689,305 B2 | 3/2010 | Kreifeldt et al. |
| 7,721,032 B2 | 5/2010 | Bushell et al. |
| 7,742,832 B1 | 6/2010 | Feldman et al. |
| 7,746,906 B2 | 6/2010 | Jinzaki et al. |

(56) References Cited

U.S. PATENT DOCUMENTS

| | | |
|---|---|---|
| 7,761,176 B2 | 7/2010 | Ben-Yaacov et al. |
| 7,792,311 B1 | 9/2010 | Holmgren et al. |
| 7,804,972 B2 | 9/2010 | Melanson |
| 7,805,210 B2 | 9/2010 | Cucos et al. |
| 7,817,960 B2 | 10/2010 | Tan et al. |
| 7,831,054 B2 | 11/2010 | Ball et al. |
| 7,849,181 B2 | 12/2010 | Slemmer et al. |
| 7,853,341 B2 | 12/2010 | McCarty et al. |
| 7,882,234 B2 | 2/2011 | Watanabe et al. |
| 7,933,418 B2 | 4/2011 | Morishima |
| 7,945,636 B2 | 5/2011 | Nelson et al. |
| 7,945,708 B2 | 5/2011 | Ohkita |
| 7,962,482 B2 | 6/2011 | Handman et al. |
| 7,966,388 B1 | 6/2011 | Pugaczewski et al. |
| 7,987,294 B2 | 7/2011 | Bryce et al. |
| 7,995,732 B2 | 8/2011 | Koch et al. |
| 8,014,423 B2 | 9/2011 | Thaler et al. |
| 8,041,062 B2 | 10/2011 | Cohen et al. |
| 8,045,952 B2 | 10/2011 | Qureshey et al. |
| 8,050,203 B2 | 11/2011 | Jacobsen et al. |
| 8,054,987 B2 | 11/2011 | Seydoux |
| 8,063,698 B2 | 11/2011 | Howard |
| 8,086,287 B2 | 12/2011 | Mooney et al. |
| 8,103,009 B2 | 1/2012 | McCarty et al. |
| 8,135,141 B2 | 3/2012 | Shiba |
| 8,139,774 B2 | 3/2012 | Berardi et al. |
| 8,150,079 B2 | 4/2012 | Maeda et al. |
| 8,160,281 B2 | 4/2012 | Kim et al. |
| 8,170,222 B2 | 5/2012 | Dunko |
| 8,175,292 B2 | 5/2012 | Aylward et al. |
| 8,189,824 B2 | 5/2012 | Strauss et al. |
| 8,229,125 B2 | 7/2012 | Short |
| 8,233,029 B2 | 7/2012 | Yoshida et al. |
| 8,233,632 B1 | 7/2012 | Macdonald et al. |
| 8,233,635 B2 | 7/2012 | Shiba |
| 8,234,395 B2 | 7/2012 | Millington et al. |
| 8,238,578 B2 | 8/2012 | Aylward |
| 8,239,559 B2 | 8/2012 | Rajapakse |
| 8,243,961 B1 | 8/2012 | Morrill |
| 8,265,310 B2 | 9/2012 | Berardi et al. |
| 8,290,185 B2 | 10/2012 | Kim |
| 8,290,603 B1 | 10/2012 | Lambourne |
| 8,306,235 B2 | 11/2012 | Mahowald |
| 8,311,226 B2 | 11/2012 | Lorgeoux et al. |
| 8,325,935 B2 | 12/2012 | Rutschman |
| 8,331,585 B2 | 12/2012 | Hagen et al. |
| 8,374,595 B2 | 2/2013 | Chien et al. |
| 8,391,501 B2 | 3/2013 | Khawand et al. |
| 8,411,883 B2 | 4/2013 | Matsumoto |
| 8,423,893 B2 | 4/2013 | Ramsay et al. |
| 8,442,239 B2 | 5/2013 | Bruelle-Drews et al. |
| 8,452,020 B2 | 5/2013 | Gregg et al. |
| 8,477,958 B2 | 7/2013 | Moeller et al. |
| 8,483,853 B1 | 7/2013 | Lambourne |
| 8,498,726 B2 | 7/2013 | Kim et al. |
| 8,565,455 B2 | 10/2013 | Worrell et al. |
| 8,577,045 B2 | 11/2013 | Gibbs |
| 8,588,432 B1 | 11/2013 | Simon |
| 8,600,075 B2 | 12/2013 | Lim |
| 8,600,084 B1 | 12/2013 | Garrett |
| 8,620,006 B2 | 12/2013 | Berardi et al. |
| 8,654,995 B2 | 2/2014 | Silber et al. |
| 8,700,730 B2 | 4/2014 | Rowe |
| 8,762,565 B2 | 6/2014 | Togashi et al. |
| 8,788,080 B1 | 7/2014 | Kallai et al. |
| 8,843,224 B2 | 9/2014 | Holmgren et al. |
| 8,843,228 B2 | 9/2014 | Lambourne |
| 8,855,319 B2 | 10/2014 | Liu et al. |
| 8,861,739 B2 | 10/2014 | Ojanpera |
| 8,879,761 B2 | 11/2014 | Johnson et al. |
| 8,886,347 B2 | 11/2014 | Lambourne |
| 8,914,559 B2 | 12/2014 | Kalayjian et al. |
| 8,923,997 B2 | 12/2014 | Kallai et al. |
| 8,934,647 B2 | 1/2015 | Joyce et al. |
| 8,934,655 B2 | 1/2015 | Breen et al. |
| 8,942,395 B2 | 1/2015 | Lissaman et al. |
| 8,965,544 B2 | 2/2015 | Ramsay |
| 8,965,546 B2 | 2/2015 | Visser et al. |
| 8,977,974 B2 | 3/2015 | Kraut |
| 8,984,442 B2 | 3/2015 | Pirnack et al. |
| 9,020,153 B2 | 4/2015 | Britt, Jr. |
| 9,042,556 B2 | 5/2015 | Kallai et al. |
| 9,219,959 B2 | 12/2015 | Kallai et al. |
| 9,226,073 B2 * | 12/2015 | Ramos ................ H04R 3/12 |
| 9,245,514 B2 | 1/2016 | Donaldson |
| 9,325,286 B1 | 4/2016 | Yang |
| 2001/0042107 A1 | 11/2001 | Palm |
| 2001/0043456 A1 | 11/2001 | Atkinson |
| 2001/0050991 A1 | 12/2001 | Eves |
| 2002/0002039 A1 | 1/2002 | Qureshey et al. |
| 2002/0003548 A1 | 1/2002 | Krusche et al. |
| 2002/0022453 A1 | 2/2002 | Balog et al. |
| 2002/0026442 A1 | 2/2002 | Lipscomb et al. |
| 2002/0072816 A1 * | 6/2002 | Shdema ............ H04L 12/2805 |
| | | 700/94 |
| 2002/0072817 A1 | 6/2002 | Champion |
| 2002/0078161 A1 | 6/2002 | Cheng |
| 2002/0078293 A1 | 6/2002 | Kou et al. |
| 2002/0098878 A1 | 7/2002 | Mooney et al. |
| 2002/0101357 A1 | 8/2002 | Gharapetian |
| 2002/0124097 A1 | 9/2002 | Isely et al. |
| 2002/0131761 A1 | 9/2002 | Kawasaki et al. |
| 2002/0137505 A1 | 9/2002 | Eiche et al. |
| 2002/0143547 A1 | 10/2002 | Fay et al. |
| 2002/0165921 A1 | 11/2002 | Sapieyevski |
| 2002/0196951 A1 | 12/2002 | Tsai |
| 2003/0002689 A1 | 1/2003 | Folio |
| 2003/0014486 A1 | 1/2003 | May |
| 2003/0020763 A1 | 1/2003 | Mayer et al. |
| 2003/0031333 A1 | 2/2003 | Cohen et al. |
| 2003/0043856 A1 | 3/2003 | Lakaniemi et al. |
| 2003/0063755 A1 | 4/2003 | Nourse et al. |
| 2003/0103088 A1 | 6/2003 | Dresti et al. |
| 2003/0157951 A1 | 8/2003 | Hasty |
| 2003/0161479 A1 | 8/2003 | Yang et al. |
| 2003/0167335 A1 | 9/2003 | Alexander |
| 2003/0177889 A1 | 9/2003 | Koseki et al. |
| 2003/0179780 A1 | 9/2003 | Walker et al. |
| 2003/0185400 A1 | 10/2003 | Yoshizawa et al. |
| 2003/0198257 A1 | 10/2003 | Sullivan et al. |
| 2003/0212802 A1 | 11/2003 | Rector et al. |
| 2003/0219007 A1 | 11/2003 | Barrack et al. |
| 2003/0231208 A1 | 12/2003 | Hanon et al. |
| 2004/0001591 A1 | 1/2004 | Mani et al. |
| 2004/0010727 A1 | 1/2004 | Fujinami |
| 2004/0014426 A1 | 1/2004 | Moore |
| 2004/0015252 A1 | 1/2004 | Aiso et al. |
| 2004/0019807 A1 | 1/2004 | Freund |
| 2004/0024478 A1 | 2/2004 | Hans et al. |
| 2004/0037433 A1 | 2/2004 | Chen |
| 2004/0042629 A1 | 3/2004 | Mellone et al. |
| 2004/0059842 A1 | 3/2004 | Hanson et al. |
| 2004/0117044 A1 | 6/2004 | Konetski |
| 2004/0117462 A1 | 6/2004 | Bodin et al. |
| 2004/0131192 A1 | 7/2004 | Metcalf |
| 2004/0147224 A1 | 7/2004 | Lee |
| 2004/0168081 A1 | 8/2004 | Ladas et al. |
| 2004/0171346 A1 | 9/2004 | Lin |
| 2004/0177167 A1 | 9/2004 | Iwamura et al. |
| 2004/0183827 A1 | 9/2004 | Putterman et al. |
| 2004/0185773 A1 | 9/2004 | Gerber et al. |
| 2004/0203590 A1 | 10/2004 | Shteyn |
| 2004/0220687 A1 | 11/2004 | Klotz et al. |
| 2004/0223622 A1 | 11/2004 | Lindemann et al. |
| 2004/0225389 A1 | 11/2004 | Ledoux et al. |
| 2004/0249490 A1 | 12/2004 | Sakai |
| 2004/0253969 A1 | 12/2004 | Nguyen et al. |
| 2005/0002535 A1 | 1/2005 | Liu et al. |
| 2005/0021470 A1 | 1/2005 | Martin et al. |
| 2005/0031135 A1 | 2/2005 | Devantier et al. |
| 2005/0060435 A1 | 3/2005 | Xue et al. |
| 2005/0069153 A1 | 3/2005 | Hall et al. |
| 2005/0100174 A1 | 5/2005 | Howard et al. |
| 2005/0131558 A1 | 6/2005 | Braithwaite et al. |

(56) References Cited

U.S. PATENT DOCUMENTS

| | | |
|---|---|---|
| 2005/0144284 A1 | 6/2005 | Ludwig et al. |
| 2005/0147261 A1 | 7/2005 | Yeh |
| 2005/0154766 A1 | 7/2005 | Huang et al. |
| 2005/0160270 A1 | 7/2005 | Goldberg et al. |
| 2005/0177256 A1 | 8/2005 | Shintani et al. |
| 2005/0197725 A1 | 9/2005 | Alexander et al. |
| 2005/0254505 A1 | 11/2005 | Chang et al. |
| 2005/0289224 A1 | 12/2005 | Deslippe et al. |
| 2005/0289244 A1 | 12/2005 | Sahu et al. |
| 2006/0041616 A1 | 2/2006 | Ludwig et al. |
| 2006/0072489 A1 | 4/2006 | Toyoshima |
| 2006/0149402 A1 | 7/2006 | Chung |
| 2006/0173844 A1 | 8/2006 | Zhang et al. |
| 2006/0179160 A1 | 8/2006 | Uehara et al. |
| 2006/0193482 A1* | 8/2006 | Harvey ................ H04R 1/1016 381/74 |
| 2006/0205349 A1 | 9/2006 | Passier et al. |
| 2006/0222186 A1 | 10/2006 | Paige et al. |
| 2006/0227985 A1 | 10/2006 | Kawanami |
| 2006/0229752 A1 | 10/2006 | Chung |
| 2006/0259649 A1 | 11/2006 | Hsieh et al. |
| 2006/0270395 A1 | 11/2006 | Dhawan et al. |
| 2006/0294569 A1 | 12/2006 | Chung |
| 2007/0003067 A1 | 1/2007 | Gierl et al. |
| 2007/0071255 A1 | 3/2007 | Schobben |
| 2007/0087686 A1 | 4/2007 | Holm et al. |
| 2007/0142022 A1 | 6/2007 | Madonna et al. |
| 2007/0142944 A1 | 6/2007 | Goldberg et al. |
| 2007/0189544 A1 | 8/2007 | Rosenberg |
| 2007/0223725 A1 | 9/2007 | Neumann et al. |
| 2007/0288610 A1 | 12/2007 | Saint et al. |
| 2008/0025535 A1 | 1/2008 | Rajapakse |
| 2008/0045140 A1 | 2/2008 | Korhonen |
| 2008/0065232 A1 | 3/2008 | Igoe |
| 2008/0066094 A1 | 3/2008 | Igoe |
| 2008/0066120 A1 | 3/2008 | Igoe |
| 2008/0075295 A1 | 3/2008 | Mayman et al. |
| 2008/0077261 A1 | 3/2008 | Baudino et al. |
| 2008/0092204 A1 | 4/2008 | Bryce et al. |
| 2008/0144861 A1 | 6/2008 | Melanson et al. |
| 2008/0144864 A1 | 6/2008 | Huon |
| 2008/0152165 A1 | 6/2008 | Zacchi |
| 2008/0159545 A1 | 7/2008 | Takumai et al. |
| 2008/0162668 A1 | 7/2008 | Miller |
| 2008/0205070 A1 | 8/2008 | Osada |
| 2008/0242222 A1 | 10/2008 | Bryce et al. |
| 2008/0247554 A1 | 10/2008 | Caffrey |
| 2008/0303947 A1 | 12/2008 | Ohnishi et al. |
| 2009/0011798 A1 | 1/2009 | Yamada |
| 2009/0060219 A1 | 3/2009 | Inohara |
| 2009/0070434 A1 | 3/2009 | Himmelstein |
| 2009/0097672 A1 | 4/2009 | Buil et al. |
| 2009/0124289 A1 | 5/2009 | Nishida |
| 2009/0169030 A1 | 7/2009 | Inohara |
| 2009/0180632 A1 | 7/2009 | Goldberg et al. |
| 2009/0228919 A1 | 9/2009 | Zott et al. |
| 2009/0232326 A1 | 9/2009 | Gordon et al. |
| 2010/0010651 A1 | 1/2010 | Kirkeby et al. |
| 2010/0052843 A1 | 3/2010 | Cannistraro |
| 2010/0067716 A1 | 3/2010 | Katayama |
| 2010/0087089 A1 | 4/2010 | Struthers et al. |
| 2010/0142735 A1 | 6/2010 | Yoon et al. |
| 2010/0153097 A1 | 6/2010 | Hotho et al. |
| 2010/0284389 A1 | 11/2010 | Ramsay et al. |
| 2010/0290643 A1* | 11/2010 | Mihelich ................ H04S 7/301 381/99 |
| 2010/0299639 A1 | 11/2010 | Ramsay et al. |
| 2011/0001632 A1 | 1/2011 | Hohorst |
| 2011/0044476 A1 | 2/2011 | Burlingame et al. |
| 2011/0110533 A1* | 5/2011 | Choi ...................... H03G 9/005 381/99 |
| 2011/0170710 A1 | 7/2011 | Son |
| 2011/0299696 A1 | 12/2011 | Holmgren et al. |
| 2011/0316768 A1 | 12/2011 | Mcrae |
| 2012/0047435 A1 | 2/2012 | Holladay et al. |
| 2012/0051558 A1 | 3/2012 | Kim et al. |
| 2012/0127831 A1 | 5/2012 | Gicklhorn et al. |
| 2012/0148075 A1 | 6/2012 | Goh et al. |
| 2012/0263325 A1 | 10/2012 | Freeman et al. |
| 2013/0010970 A1 | 1/2013 | Hegarty et al. |
| 2013/0028443 A1 | 1/2013 | Pance et al. |
| 2013/0051572 A1 | 2/2013 | Goh et al. |
| 2013/0129122 A1 | 5/2013 | Johnson et al. |
| 2013/0243199 A1 | 9/2013 | Kallai et al. |
| 2013/0253679 A1 | 9/2013 | Lambourne |
| 2013/0259254 A1 | 10/2013 | Xiang et al. |
| 2013/0293345 A1 | 11/2013 | Lambourne |
| 2013/0305152 A1 | 11/2013 | Griffiths et al. |
| 2014/0016784 A1 | 1/2014 | Sen et al. |
| 2014/0016786 A1 | 1/2014 | Sen |
| 2014/0016802 A1 | 1/2014 | Sen |
| 2014/0023196 A1 | 1/2014 | Xiang et al. |
| 2014/0112481 A1 | 4/2014 | Li et al. |
| 2014/0219456 A1 | 8/2014 | Morrell et al. |
| 2014/0226823 A1 | 8/2014 | Sen et al. |
| 2014/0294200 A1 | 10/2014 | Baumgarte et al. |
| 2014/0355768 A1 | 12/2014 | Sen et al. |
| 2014/0355794 A1 | 12/2014 | Morrell et al. |
| 2015/0063610 A1 | 3/2015 | Mossner |
| 2015/0146886 A1 | 5/2015 | Baumgarte |
| 2015/0201274 A1 | 7/2015 | Ellner et al. |
| 2015/0281866 A1 | 10/2015 | Williams et al. |
| 2015/0365987 A1 | 12/2015 | Weel |

FOREIGN PATENT DOCUMENTS

| | | |
|---|---|---|
| EP | 1133896 B1 | 8/2002 |
| EP | 1312188 A1 | 5/2003 |
| EP | 1517464 A2 | 3/2005 |
| EP | 1416687 B1 | 8/2006 |
| EP | 1410686 | 3/2008 |
| EP | 1825713 B1 | 10/2012 |
| EP | 0742674 B1 | 4/2014 |
| EP | 2860992 A1 | 4/2015 |
| GB | 2379533 A | 3/2003 |
| JP | 63269633 | 11/1988 |
| JP | 2000149391 A | 5/2000 |
| JP | 2009218888 | 9/2009 |
| JP | 2011010183 A | 1/2011 |
| JP | 2011176581 | 9/2011 |
| TW | 439027 | 6/2001 |
| WO | 9923560 | 5/1999 |
| WO | 0019693 A1 | 4/2000 |
| WO | 200153994 | 7/2001 |
| WO | 2005013047 | 2/2005 |
| WO | 2007135581 A2 | 11/2007 |
| WO | 2008082350 A1 | 7/2008 |
| WO | 2012137190 A1 | 10/2012 |
| WO | 2013012582 | 1/2013 |
| WO | 2015024881 A1 | 2/2015 |

OTHER PUBLICATIONS

"AudioTron Quick Start Guide, Version 1.0", Voyetra Turtle Beach, Inc., Mar. 2001, 24 pages.

"AudioTron Reference Manual, Version 3.0", Voyetra Turtle Beach, Inc., May 2002, 70 pages.

"AudioTron Setup Guide, Version 3.0", Voyetra Turtle Beach, Inc., May 2002, 38 pages.

Bluetooth. "Specification of the Bluetooth System: The ad hoc SCATTERNET for affordable and highly functional wireless connectivity," Core, Version 1.0 A, Jul. 26, 1999, 1068 pages.

Bluetooth. "Specification of the Bluetooth System: Wireless connections made easy," Core, Version 1.0 B, Dec. 1, 1999, 1076 pages.

Corrected Notice of Allowance mailed on Mar. 12, 2015, issued in connection with U.S. Appl. No. 13/630,565, filed Sep. 28, 2012, 4 pages.

Dell, Inc. "Dell Digital Audio Receiver: Reference Guide," Jun. 2000, 70 pages.

Dell, Inc. "Start Here," Jun. 2000, 2 pages.

Final Office Action mailed on Jul. 2, 2015, issued in connection with U.S. Appl. No. 13/458,558, filed Apr. 27, 2012, 11 pages.

(56) References Cited

OTHER PUBLICATIONS

Jo et al., "Synchronized One-to-many Media Streaming with Adaptive Playout Control," Proceedings of SPIE, 2002, pp. 71-82, vol. 4861.
Jones, Stephen, "Dell Digital Audio Receiver: Digital upgrade for your analog stereo" Analog Stereo Jun. 24, 2000 retrieved Jun. 18, 2014, 2 pages.
Louderback, Jim, "Affordable Audio Receiver Furnishes Homes With MP3," TechTV Vault. Jun. 28, 2000 retrieved Jul. 10, 2014, 2 pages.
Mills David L., "Network Time Protocol (Version 3) Specification, Implementation and Analysis," Network Working Group, Mar. 1992, 7 pages.
Non-Final Office Action mailed on Jul. 7, 2015, issued in connection with U.S. Appl. No. 14/174,244, filed Feb. 6, 2014, 9 pages.
Non-Final Office Action mailed on Feb. 10, 2016, issued in connection with U.S. Appl. No. 14/937,571, filed Nov. 10, 2015, 9 pages.
Non-Final Office Action mailed on Jul. 15, 2015, issued in connection with U.S. Appl. No. 14/174,253, filed Feb. 6, 2014, 9 pages.
Non-Final Office Action mailed on Dec. 17, 2015, issued in connection with U.S. Appl. No. 13/458,558, filed Apr. 27, 2012, 10 pages.
Non-Final Office Action mailed on Dec. 22, 2014, issued in connection with U.S. Appl. No. 13/458,558, filed Apr. 27, 2012, 11 pages.
Non-Final Office Action mailed on Sep. 23, 2014, issued in connection with U.S. Appl. No. 13/630,565, filed Sep. 28, 2012, 7 pages.
Non-Final Office Action mailed on Jan. 29, 2016, issued in connection with U.S. Appl. No. 14/937,523, filed Nov. 10, 2015, 10 pages.
Notice of Allowance mailed on Mar. 10, 2016, issued in connection with U.S. Appl. No. 14/937,523, filed Nov. 10, 2015, 5 pages.
Notice of Allowance mailed on Mar. 15, 2016, issued in connection with U.S. Appl. No. 14/937,571, filed Nov. 10, 2015, 5 pages.
Notice of Allowance mailed on Oct. 21, 2015, issued in connection with U.S. Appl. No. 14/174,244, filed Feb. 6, 2014, 5 pages.
Notice of Allowance mailed on Oct. 21, 2015, issued in connection with U.S. Appl. No. 14/174,253, filed Feb. 6, 2014, 6 pages.
Notice of Allowance mailed on Jan. 22, 2015, issued in connection with U.S. Appl. No. 13/630,565, filed Sep. 28, 2012, 7 pages.
Palm, Inc., "Handbook for the Palm VII Handheld," May 2000, 311 pages.
Polycom Conference Composer manual: copyright 2001.
Presentations at WinHEC 2000, May 2000, 138 pages.
JPnP; "Universal Plug and Play Device Architecture," Jun. 8, 2000; version 1.0; Microsoft Corporation; pp. 1-54.
Yamaha DME 32 manual: copyright 2001.
Advisory Action mailed on Dec. 22, 2011, issued in connection with U.S. Appl. No. 11/853,790, filed Sep. 11, 2007, 2 pages.
Breebaart et al., "Multi-Channel Goes Mobile: MPEG Surround Binaural Rendering", AES 29th International conference, Sep. 2-4, 2006, 1-13.
Canadian Patent Office, Office Action mailed on Apr. 10, 2015, issued in connection with Canadian Patent Application No. 2,832,542, 3 pages.
Chinese Patent Office, Office Action mailed on Nov. 27, 2015, issued in connection with Chinese Patent Application No. 201280028038.9, 26 pages.
Corrected Notice of Allowance mailed on Oct. 30, 2015, issued in connection with U.S. Appl. No. 13/013,740, filed Jan. 25, 2011, 2 pages.
Dorwaldt; Carl, "Ease 4.1 Tutorial", Renkus-Heinz, Inc., 2004, 417 pages.
Dynaudio Acoustics Air Series, http://www.soundonsound.com/sos/sep02/articles/dynaudioair.asp, 2002, 4 pages.
European Patent Office, European Search Report mailed on Jul. 5, 2016, issued in connection with European Patent Application No. 16156935.5, 9 pages.

Faller, Christof, "Coding of Spatial Audio Compatible with Different Playback Formats", Audio Engineering Society convention Paper (Presented at the 117th Convention), Oct. 28-31, 2004, 12 pages.
Final Office Action mailed Jul. 23, 2014, issued in connection with U.S. Appl. No. 13/896,037, filed May 16, 2013, 12 pages.
Final Office Action mailed on Jul. 1, 2016, issued in connection with U.S. Appl. No. 13/458,558, filed Apr. 27, 2012, 11 pages.
Final Office Action mailed on Feb. 10, 2014, issued in connection with U.S Appl. No. 13/013,740, filed Jan. 25, 2011, 13 pages.
Final Office Action mailed on Oct. 13, 2011, issued in connection with U.S. Appl. No. 11/853,790, filed Sep. 11, 2007, 10 pages.
Final Office Action mailed on Jun. 29, 2015, issued in connection with U.S. Appl. No. 14/465,457, filed Aug. 21, 2014, 13 pages.
Herre et al., "The Reference Model Architecture for MPEG Spatial Audio Coding", Audio Engineering Society convention Paper (Presented at the 118th Convention), May 28-31, 2005, 13 pages.
ID3 tag version 2.4.0—Native Frames, Draft Specification, copyright 2000, 41 pages.
International Bureau, International Preliminary Report on Patentability, mailed on Oct. 17, 2013, issued in connection with International Application No. PCT/IB2012/052071, filed on Apr. 26, 2012, 7 pages.
International Searching Authority, International Search Report for Application No. PCT/IB2012/052071, mailed Aug. 23, 2012, 3 pages.
International Searching Authority, Written Opinion mailed on Aug. 23, 2012, issued in connection with International Application No. PCT/IB2012/052071, filed on Apr. 26, 2012, 6 pages.
Japanese Intellectual Property Office, Office Action Summary mailed on Sep. 8, 2015, issued in connection with Japanese Patent Application No. 2014-503273, 4 pages.
Japanese Intellectual Property Office, Office Action mailed on Jan. 6, 2015, issued in connection with Japanese Patent Application No. 2014-503273, 5 pages.
Non-Final Office Action mailed Jan. 7, 2014, issued in connection with U.S. Appl. No. 13/896,829, filed May 17, 2013, 11 pages.
Non-Final Office Action mailed Feb. 10, 2014, issued in connection with U.S. Appl. No. 13/083,499, filed Apr. 8, 2011, 12 pages.
Non-Final Office Action mailed Jul. 23, 2014, issued in connection with U.S Appl. No. 14/256,434, filed Apr. 18, 2014, 12 pages.
Non-Final Office Action mailed on Mar. 8, 2011, issued in connection with U.S. Appl. No. 11/853,790, filed Sep. 11, 2007, 10 pages.
Non-Final Office Action mailed on May 9, 2014, issued in connection with U.S. Appl. No. 13/892,230, filed May 10, 2013, 10 pages.
Non-Final Office Action mailed on Feb. 13, 2014, issued in connection with U.S. Appl. No. 13/896,037, filed May 16, 2013, 9 pages.
Non-Final Office Action mailed on Feb. 13, 2015, issued in connection with U.S. Appl. No. 13/013,740, filed Jan. 25, 2011, 14 pages.
Non-Final Office Action mailed on Jun. 13, 2016, issued in connection with U.S. Appl. No. 14/620,937, filed Feb. 12, 2015, 12 pages.
Non-Final Office Action mailed on Jun. 13, 2016, issued in connection with U.S. Appl. No. 15/134,761, filed Apr. 21, 2016, 10 pages.
Non-Final Office Action mailed on Mar. 23, 2015, issued in connection with U.S. Appl. No. 14/299,847, filed Jun. 9, 2014, 14 pages.
Non-Final Office Action mailed on Jan. 27, 2015, issued in connection with U.S. Appl. No. 14/465,457, filed Aug. 21, 2014, 11 pages.
Non-Final Office Action mailed on Sep. 27, 2013, issued in connection with U.S. Appl. No. 13/013,740, filed Jan. 25, 2011, 12 pages.
Office Action mailed on Jun. 29, 2016, issued in connection with U.S. Appl. No. 14/629,937, filed Feb. 24, 2015, 12 pages.
Notice of Allowability mailed on Apr. 18, 2013, issued in connection with U.S. Appl. No. 11/853,790, filed Sep. 11, 2007, 4 pages.
Notice of Allowance mailed on Jun. 2, 2014, issued in connection with U.S. Appl. No. 13/083,499, filed Apr. 8, 2011, 5 pages.
Notice of Allowance mailed on Dec. 5, 2014, issued in connection with U.S. Appl. No. 14/256,434, filed Apr. 18, 2014, 7 pages.

(56) References Cited

OTHER PUBLICATIONS

Notice of Allowance mailed on Sep. 9, 2016, issued in connection with U.S. Appl. No. 15/134,761, filed Apr. 21, 2016, 7 pages.
Notice of Allowance mailed on Jul. 10, 2015, issued in connection with U.S. Appl. No. 13/013,740, filed Jan. 25, 2011, 9 pages.
Notice of Allowance mailed on Sep. 10, 2014, issued in connection with U.S. Appl. No. 13/892,230, filed May 10, 2013, 5 pages.
Notice of Allowance mailed on Jun. 12, 2014, issued in connection with U.S. Appl. No. 13/896,829, filed May 17, 2013, 5 pages.
Notice of Allowance mailed on May 13, 2015, issued in connection with U.S. Appl. No. 14/299,847, filed Jun. 9, 2014, 10 pages.
Notice of Allowance mailed on Aug. 19, 2016, issued in connection with U.S. Appl. No. 14/619,813, filed Feb. 11, 2015, 9 pages.
Notice of Allowance mailed on Jan. 20, 2016, issued in connection with U.S. Appl. No. 14/465,457, filed Aug. 21, 2014, 10 pages.
Notice of Allowance mailed on Oct. 27, 2015, issued in connection with U.S. Appl. No. 14/299,847, filed Jun. 9, 2014, 5 pages.
Notice of Allowance mailed on Oct. 28, 2014, issued in connection with U.S. Appl. No. 13/896,037, filed May 16, 2013, 7 pages.
Preinterview First Office Action mailed on Jun. 8, 2016, issued in connection with U.S. Appl. No. 14/619,813, filed Feb. 11, 2015, 4 pages.
Rane: DragNet software; available for sale at least 2006.
Sonos Controller for iPad Product Guide; copyright 2004-2013; 47 pages.
*Sonos, Inc.* v. *D&M Holdings Inc. et al.*, Defendants' Initial Invalidity Contentions Exhibit 11: Defendants' Invalidity Contentions for U.S. Pat. No. 9,219,959 filed Apr. 15, 2016, 172 pages.
*Sonos, Inc.* v. *D&M Holdings Inc. et al.*, Defendant's Initial Invalidity Contentions Exhibit 9: Defendants' Invalidity Contentions for U.S. Pat. No. 9,202,509 filed Apr. 15, 2016, 163 pages.
Sonos Play:3 Product Guide; copyright 2004-2011; 2 pages.
Sonos Play:3 Product Guide; copyright 2004-2012; 14 pages.
Sonos Play:3 Product Guide; copyright 2004-2013; 15 pages.
Yamaha DME 64 Owner's Manual; copyright 2004, 80 pages.
Yamaha DME Designer 3.5 setup manual guide; copyright 2004, 16 pages.
Yamaha DME Designer 3.5 User Manual; Copyright 2004, 507 pages.
Yamaha DME Designer software manual: Copyright 2004, 482 pages.
"884+ Automatic Matrix Mixer Control System," Ivie Technologies, Inc., 2000, pp. 1-4.
Advanced Driver Tab User Interface WaveLan GUI Guide, AVAGO0009, Agere Systems, Feb. 2004, 4 pages.
Agere Systems' Voice-over-Wireless LAN (VoWLAN) Station Quality of Service, AVAG00015, Agere Systems, Jan. 2005, 5 pages.
Akyildiz et al., "Multimedia Group Synchronization Protocols for Integrated Services Networks," IEEE Journal on Selected Areas in Communications, 1996 pp. 162-173, vol. 14, No. 1.
Audio Authority: How to Install and Use the Model 1154 Signal Sensing Auto Selector, 2002, 4 pages.
Audio Authority: Model 1154B High Definition AV Auto Selector, 2008, 8 pages.
AudioSource: AMP 100 User Manual, 2003, 4 pages.
Automatic Profile Hunting Functional Description, AVAGO0013, Agere Systems, Feb. 2004, 2 pages.
AXIS Communication: AXIS P8221 Network I/O Audio Module, 2009, 41 pages.
Balfanz et al., "Network-in-a-Box: How to Set Up a Secure Wireless Network in Under a Minute", 13th USENIX Security Symposium—Technical Paper, 2002, 23 pages.
Balfanz et al., "Talking to Strangers: Authentication in Ad-Hoc Wireless Networks", Xerox Palo Alto Research Center, 2002, 13 pages.
Barham et al., "Wide Area Audio Synchronisation", University of Cambridge Computer Laboratory, 1995, 5 pages.
Bogen Communications, Inc., ProMatrix Digitally Matrixed Amplifier Model PM3180, Copyright 1996, 2 pages.

Brassil et al., "Enhancing Internet Streaming Media with Cueing Protocols", 2000, 9 pages.
Cen et al., "A Distributed Real-Time MPEG Video Audio Player", Department of Computer Science and Engineering. Oregon Graduate Institute of Science and Technology, 1995, 12 pages.
Change Notification: Agere Systems WaveLan Multimode Reference Design (D2 to D3), AVAGO0042, Agere Systems, Nov. 2004, 2 pages.
Dannenberg et al., "A. System Supporting Flexible Distributed Real-Time Music Processing", Proceedings of the 2001 International Computer Music Conference, 2001, 4 pages.
Dannenberg; Roger B., "Remote Access to Interactive Media", Proceedings of the SPIE 1785, 1993, 230-237.
Day, Rebecca, "Going Elan!" Primedia Inc., 2003, 4 pages.
Deep-Sleep Implementation in WL60011 for IEEE 802.11b Applications, AVAG00020, Agere Systems, Jul. 2004, 22 pages.
Denon AV Surround Receiver AVR-1604/684 User's Manual, 2004, 128 pages.
Denon AV Surround Receiver AVR-5800 Operating Instructions, Copyright 2000, 67 pages.
Fireball DVD and Music Manager DVDM-100 Installation and User's Guide, Copyright 2003, 185 pages.
Fireball MP-200 User's Manual, Copyright 2006, 93 pages.
Fireball Remote Control Guide WD006-1-1, Copyright 2003, 19 pages.
Fireball SE-D1 User's Manual, Copyright 2005, 90 pages.
Fober et al., "Clock Skew Compensation over a High Latency Network," Proceedings of the ICMC, 2002, pp. 548-552.
Gaston et al., "Methods for Sharing Stereo and Multichannel Recordings Among Planetariums", Audio Engineering Society Convention Paper 7474, 2008, 15 pages.
IBM Home Director Installation and Service Manual, Copyright 1998, 124 pages.
IBM Home Director Owner's Manual, Copyright 1999, 67 pages.
Integra Service Manual, Audio Network Receiver Model NAC-2.3, Dec. 2002, 44 pages.
Ishibashi et al., "A Comparison of Media Synchronization Quality Among Reactive Control Schemes," IEEE Infocom, 2001, pp. 77-84.
Issues with Mixed IEEE 802.b/802.11g Networks, AVAGO0058, Agere Systems, Feb. 2004, 5 pages.
Lake Processors: Lake® LM Series Digital Audio Processors Operation Manual, 2011, 71 pages.
"A/V Surround Receiver AVR-5800," Denon Electronics, 2000, 2 pages.
"A/V System Controller, Owner's Manual," B&K Compontents, Ltd., 1998, 52 pages.
"Denon 2003-2004 Product Catalog," Denon, 2003-2004, 44 pages.
"DP-0206 Digital Signal Processor," TOA Electronics, Inc., 2001, pp. 1-12.
"Home Theater Control Systems," Cinema Source, 2002, 19 pages.
"Model MRC44 Four Zone—Four Source Audio/Video Controller/Amplifier System," Xantech Corporation, 2002, 52 pages.
"NexSys Software v. 3 Manual," Crest Audio, Inc., 1997, 76 pages.
"Residential Distributed Audio Wiring Practices," Leviton Network Solutions, 2001, 13 pages.
"RVL-6 Modular Multi-Room Controller, Installation & Operation Guide," Nile Audio Corporations, 1999, 46 pages.
"Systemline Modular Installation Guide, Multiroom System," Systemline, 2003, pp. 1-22.
"ZR-8630AV MultiZone Audio/Video Receiver, Installation and Operation Guide," Niles Audio Corporation, 2003, 86 pages.
*Sonos, Inc.* v. *D&M Holdings Inc. et al.*, Opening Brief in Support of Defendants' Partial Motion for Judgment on the Pleadings for Lack of Patent-Eligible Subject Matter, filed May 6, 2016, 27 pages.
*Sonos, Inc.* v. *D&M Holdings Inc. et al.*, Plaintiff Sonos, Inc.'s Opening Claim Construction Brief, filed Sep. 9, 2016, 26 pages.
*Sonos, Inc.* v. *D&M Holdings Inc. et al.*, Plaintiff Sonos, Inc.'s Response in Opposition to Defendants' Partial Motion for Judgment on the Pleadings, filed May 27, 2016, 24 pages.
*Sonos, Inc.* v. *D&M Holdings Inc. et al.*, Second Amended Complaint for Patent Infringement, filed Feb. 27, 2015, 49 pages.

(56) References Cited

OTHER PUBLICATIONS

*Sonos, Inc.* v. *D&M Holdings Inc. et al.*, Third Amended Complaint for Patent Infringement, filed Jan. 29, 2016, 47 pages.
Sony: AIR-SA 50R Wireless Speaker, Copyright 2009, 2 pages.
Sony: Altus Quick Setup Guide ALT-SA32PC, Copyright 2009, 2 pages.
Sony: BD/DVD Home Theatre System Operating Instructions for BDV-E300, E301 and E801, Copyright 2009, 115 pages.
Sony: BD/DVD Home Theatre System Operating Instructions for BDV-IT1000/BDV-IS1000, Copyright 2008, 159 pages.
Sony: Blu-ray Disc/DVD Home Theatre System Operating Instructions for BDV-IZ1000W, Copyright 2010, 88 pages.
Sony: DVD Home Theatre System Operating Instructions for DAV-DZ380W/DZ680W/DZ880W, Copyright 2009, 136 pages.
Sony: DVD Home Theatre System Operating Instruction for DAV-DZ870W, Copyright 2008, 128 pages.
Sony Ericsson MS500 User Guide, Copyright 2009, 2 pages.
Sony: Home Theatre System Operating Instructions for HT-IS100, Copyright 2008, 168 pages.
Sony: HT-IS100, 5.1 Channel Audio System, last updated Nov. 2009, 2 pages.
Sony: Multi Channel AV Receiver Operating Instructions, 2007, 80 pages.
Sony: Multi Channel AV Receiver Operating Instructions for STR-DN1000, Copyright 2009, 136 pages.
Sony: STR-DN1000, Audio Video Receiver, last updated Aug. 2009, 2 pages.
Sony: Wireless Surround Kit Operating Instructions for WHAT-SA2, Copyright 2010, 56 pages.
Taylor, Marilou, "Long Island Sound," Audio Video Interiors, Apr. 2000, 8 pages.
TOA Corporation, Digital Processor DP-0206 DACsys2000 Version 2.00 Software Instruction Manual, Copyright 2001, 67 pages.
WaveLan High-Speed Multimode Chip Set, AVAGO0003, Agere Systems, Feb. 2003, 4 pages.
WaveLan High-Speed Multimode Chip Set, AVAGO0005, Agere Systems, Feb. 2003, 4 pages.
WaveLAN Wireless Integration Developer Kit (WI-DK) for Access Point Developers, AVAGO0054, Agere Systems, Jul. 2003, 2 pages.
WaveLAN Wireless Integration-Developer Kit (WI-DK) Hardware Control Function (HCF), AVAGO0052, Agere Systems, Jul. 2003, 2 pages.
WI-DK Release 2 WaveLan Embedded Drivers for VxWorks and Linux, AVAGO0056, Agere Systems, Jul. 2003, 2 pages.
WI-DK Release 2 WaveLan END Reference Driver for VxWorks, AVAGO0044, Agere Systems, Jul. 2003, 2 pages.
WI-DK Release 2 WaveLan LKM Reference Drivers for Linux, AVAGO0048, Agere Systems, Jul. 2003, 4 pages.
WPA Reauthentication Rates, AVAGO0063, Agere Systems, Feb. 2004, 3 pages.
ZX135: Installation Manual, LA Audio, Apr. 2003, 44 pages.
LG: RJP-201M Remote Jack Pack Installation and Setup Guide, 2010, 24 pages.
Lienhart et al., "On the Importance of Exact Synchronization for Distributed Audio Signal Processing", Session L: Poster Session II—ICASSP'03 Papers, 2002, 1 page.
LinkSys by Cisco, Wireless Home Audio Controller, Wireless-N Touchscreen Remote DMRW1000 Datasheet, Copyright 2008, 2 pages.
LinkSys by Cisco, Wireless Home Audio Controller, Wireless-N Touchscreen Remote DMRW1000 User Guide, Copyright 2008, 64 pages.
LinkSys by Cisco, Wireless Home Audio Player, Wireless-N Music Extender DMP100 Quick Installation Guide, Copyright 2009, 32 pages.
LinkSys by Cisco, Wireless Home Audio Player, Wireless-N Music Extender DMP100 User Guide, Copyright 2008, 65 pages.
Liu et al., "A synchronization control scheme for real-time streaming multimedia applications," Packet Video. 2003, 10 pages, vol. 2003.

Liu et al., "Adaptive Delay Concealment for Internet Voice Applications with Packet-Based Time-Scale Modification." Information Technologies 2000, pp. 91-102.
Parasound Zpre2 Zone Preamplifier with PTZI Remote Control, 2005, 16 pages.
Pillai et al., "A Method to Improve the Robustness of MPEG Video Applications over Wireless Networks", Kent Ridge Digital Labs, 2000, 15 pages.
Proficient Audio Systems M6 Quick Start Guide, 2011, 5 pages.
Proficient Audio Systems: Proficient Editor Advanced Programming Guide, 2007, 40 pages.
Programming Interface for WL54040 Dual-Band Wireless Transceiver, AVAGO0066, Agere Systems, May 2004, 16 pages.
Radio Shack, "Auto-Sensing 4-Way Audio/Video Selector Switch", 2004, 1 page.
RadioShack, Pro-2053 Scanner, 2002 Catalog, part 1, 100 pages.
RadioShack, Pro-2053 Scanner, 2002 Catalog, part 2, 100 pages.
RadioShack, Pro-2053 Scanner, 2002 Catalog, part 3, 100 pages.
RadioShack, Pro-2053 Scanner, 2002 Catalog, part 4, 100 pages.
RadioShack, Pro-2053 Scanner, 2002 Catalog, part 5, 46 pages.
Rangan et al., "Feedback Techniques for Continuity and Synchronization in Multimedia Information Retrieval", ACM Transactions on Information Systems, 1995, 13(2), 145-176.
Reid, Mark, "Multimedia conferencing over ISDN and IP networks using ITU-T H-series recommendations: architecture, control and coordination," Computer Networks, 1999, vol. 31, pp. 225-235.
Rothermel et al., "An Adaptive Protocol for Synchronizing Media Streams", Institute of Parallel and Distributed High-Performance Systems (IPVR), 1997, 26 pages.
Rothermel et al., "An Adaptive Stream Synchronization Protocol," 5th International Workshop on Network and Operating System Support for Digital Audio and Video, Apr. 18-21, 1995, 12 pages.
Rothermel et al., "Synchronization in Joint-Viewing Environments", University of Stuttgart Institute of Parallel and Distributed High-Performance Systems, 1992, 13 pages.
*Sonos, Inc.* v. *D&M Holdings Inc. et al.*, Complaint for Patent Infringement, filed Oct. 21, 2014, 20 pages.
*Sonos, Inc.* v. *D&M Holdings Inc. et al.*, Declaration of Steven C. Visser, executed Sep. 9, 2016, 40 pages.
*Sonos, Inc.* v. *D&M Holdings Inc. et al.*, Defendant's Amended Invalidity Contentions, filed Sep. 14, 2016, 100 pages.
*Sonos, Inc.* v. *D&M Holdings Inc. et al.*, Defendant's Initial Invalidity Contentions Exhibit 1: Defendants' Invalidity Contentions for U.S. Pat. No. 7,571,014 filed Apr. 15, 2016, 161 pages.
*Sonos, Inc.* v. *D&M Holdings Inc. et al.*, Defendant's Initial Invalidity Contentions Exhibit 10: Defendants' Invalidity Contentions for U.S. Pat. No. 9,213,357 filed Apr. 15, 2016, 244 pages.
*Sonos, Inc.* v. *D&M Holdings Inc. et al.*, Defendant's Initial Invalidity Contentions Exhibit 11: Defendants' Invalidity Contentions for U.S. Pat. No. 9,219,959 filed Apr. 15, 2016, 172 pages.
*Sonos, Inc.* v. *D&M Holdings Inc. et al.*, Defendant's Initial Invalidity Contentions Exhibit 12: Defendants' Invalidity Contentions for U.S. Pat. No. D. 559,197 filed Apr. 15, 2016, 36 pages.
*Sonos, Inc.* v. *D&M Holdings Inc. et al.*, Defendant's Initial Invalidity Contentions Exhibit 2: Defendants' Invalidity Contentions for U.S. Pat. No. 8,588,949 filed Apr. 15, 2016, 112 pages.
*Sonos, Inc.* v. *D&M Holdings Inc. et al.*, Defendant's Initial Invalidity Contentions Exhibit 3: Defendants' Invalidity Contentions for U.S. Pat. No. 8,843,224 filed Apr. 15, 2016, 118 pages.
*Sonos, Inc.* v. *D&M Holdings Inc. et al.*, Defendant's Initial Invalidity Contentions Exhibit 4: Defendants' Invalidity Contentions for U.S. Pat. No. 8,938,312 filed Apr. 15, 2016, 217 pages.
*Sonos, Inc.* v. *D&M Holdings Inc. et al.*, Defendant's Initial Invalidity Contentions Exhibit 5: Defendants' Invalidity Contentions for U.S. Pat. No. 8,938,637 filed Apr. 15, 2016, 177 pages.
*Sonos, Inc.* v. *D&M Holdings Inc. et al.*, Defendant's Initial Invalidity Contentions Exhibit 6: Defendants' Invalidity Contentions for U.S. Pat. No. 9,042,556 filed Apr. 15, 2016, 86 pages.
*Sonos, Inc.* v. *D&M Holdings Inc. et al.*, Defendant's Initial Invalidity Contentions Exhibit 7: Defendants' Invalidity Contentions for U.S. Pat. No. 9,130,771 filed Apr. 15, 2016, 203 pages.

(56) References Cited

OTHER PUBLICATIONS

*Sonos, Inc.* v. *D&M Holdings Inc. et al.*, Defendant's Initial Invalidity Contentions Exhibit 8: Defendants' Invalidity Contentions for U.S. Pat. No. 9,195,258 filed Apr. 15, 2016, 400 pages.
*Sonos, Inc.* v. *D&M Holdings Inc. et al.*, Defendant's Initial Invalidity Contentions, filed Apr. 15, 2016, 97 pages.
*Sonos, Inc.* v. *D&M Holdings Inc. et al.*, Defendant's Preliminary Identification of Indefinite Terms, provided Jul. 29, 2016, 8 pages.
*Sonos, Inc.* v. *D&M Holdings Inc. et al.*, Defendant's Preliminary Identification of Prior Art References, provided Jul. 29, 2016, 5 pages.
*Sonos, Inc.* v. *D&M Holdings Inc. et al.*, Defendants' Amended Answer, Defenses, and Counterclaims for Patent Infringement, filed Nov. 30, 2015, 47 pages.
*Sonos, Inc.* v. *D&M Holdings Inc. et al.*, Defendants' Answer to Plaintiff's Second Amended Complaint, filed Apr. 30, 2015, 19 pages.
*Sonos, Inc.* v. *D&M Holdings Inc. et al.*, Defendants' First Amended Answer to Plaintiffs' Third Amended Complaint, filed Sep. 7, 2016, 23 pages.
*Sonos, Inc.* v. *D&M Holdings Inc. et al.*, Defendants' Reply in Support of Partial Motion for Judgment on the Pleadings, filed Jun. 10, 2016, 15 pages.
*Sonos, Inc.* v. *D&M Holdings Inc. et al.*, Exhibit A: Defendants' Second Amended Answer to Plaintiffs' Third Amended complaint, filed Sep. 9, 2016, 43 pages.
*Sonos, Inc.* v. *D&M Holdings Inc. et al.*, First Amended Complaint for Patent Infringement, filed Dec. 17, 2014, 26 pages.
*Sonos, Inc.* v. *D&M Holdings Inc. et al.*, Joint Claim Construction Chart, vol. 1 of 3 with Exhibits A-O, filed Aug. 17, 2016, 30 pages.
Advisory Action mailed on Oct. 6, 2016, issued in connection with U.S. Appl. No. 13/458,558, filed Apr. 27, 2012, 4 pages.
Anonymous, "Information technology—Generic coding of moving pictures and associated audio information—Part 3: Audio," ISO/IEC 13818-3, Apr. 1998, pp. 15.
Anonymous, "Transmission Control Protocol," RFC: 793, USC/Information Sciences Institute, Sep. 1981, 91 pages.
Buerk et al., "AVTransport:1 Service Template Version 1.01," Contributing Members of the UPnP Forum, Jun. 25, 2002, 67 pages.
Kou et al., "RenderingControl:1 Service Template Verion 1.01," Contributing Members of the UPnP Forum, Jun. 25, 2002, 63 pages.
Non-Final Office Action mailed on Oct. 12, 2016, issued in connection with U.S. Appl. No. 14/505,966, filed Oct. 3, 2014, 10 pages.
Non-Final Office Action mailed on Oct. 20, 2016, issued in connection with U.S. Appl. No. 14/563,515, filed Dec. 8, 2014, 10 pages.
Non-Final Office Action mailed on Sep. 27, 2016, issued in connection with U.S. Appl. No. 15/228,685, filed Aug. 4, 2016, 8 pages.
Non-Final Office Action mailed on Oct. 31, 2016, issued in connection with U.S. Appl. No. 14/806,070, filed Jul. 22, 2015, 11 pages.
Notice of Allowance mailed on Oct. 24, 2016, issued in connection with U.S. Appl. No. 15/134,761, filed Apr. 21, 2016, 7 pages.
Postel, J., "User Datagram Protocol," RFC: 768, USC/Information Sciences Institute, Aug. 1980, 3 pages.
Reexam Non-Final Office Action mailed on Oct. 17, 2016, issued in connection with U.S. Appl. No. 90/013,756, filed May 25, 2016, 31 pages.
Ritchie et al., "MediaServer:1 Device Template Version 1.01," Contributing Members of the UPnP Forum, Jun. 25, 2002, 12 pages.
Ritchie et al., "UPnP AV Architecture:1, Version 1.0," Contributing Members of the UPnP Forum, Jun. 25, 2002, 22 pages.
Ritchie, John, "MediaRenderer:1 Device Template Version 1.01," Contributing Members of the UPnP Forum, Jun. 25, 2002, 12 pages.
Schulzrinne et al., "RTP: A Transport Protocol for Real-Time Applications," Network Working Group, RFC: 3550, Standards Track, Jul. 2003, 104 pages.
Sonos Digital Music System User Guide, Version: 050801, Aug. 2005, 114 pages.
Sonos Multi-Room Music System User Guide, Version: 091001, 2009, 299 pages.
Japanese Patent Office, Office Action mailed on Nov. 1, 2016, issued in connection with Japanese Application No. 2015-238682, 5 pages.

\* cited by examiner

AUDIO OUTPUT BALANCING

CROSS REFERENCE TO RELATED APPLICATIONS

This application claims priority under 35 U.S.C. §120 to, and is a continuation of, U.S. non-provisional patent application Ser. No. 14/937,523, filed on Nov. 10, 2015, entitled "Audio Output Balancing," which is incorporated herein by reference. U.S. non-provisional patent application Ser. No. 14/937,523 claims priority under 35 U.S.C. §120 to, and is a continuation of, U.S. non-provisional patent application Ser. No. 14/174,253, filed on Feb. 6, 2014, entitled "Audio Output Balancing During Synchronized Playback," and issued as U.S. Pat. No. 9,226,073 on Dec. 29, 2015, which is also incorporated herein by reference.

FIELD OF THE DISCLOSURE

The disclosure is related to consumer goods and, more particularly, to methods, systems, products, features, services, and other elements directed to media playback or some aspect thereof.

BACKGROUND

Options for accessing and listening to digital audio in an out-loud setting were severely limited until in 2003, when SONOS, Inc. filed for one of its first patent applications, entitled "Method for Synchronizing Audio Playback between Multiple Networked Devices," and began offering a media playback system for sale in 2005. The Sonos Wireless HiFi System enables people to experience music from virtually unlimited sources via one or more networked playback devices. Through a software control application installed on a smartphone, tablet, or computer, one can play what he or she wants in any room that has a networked playback device. Additionally, using the controller, for example, different songs can be streamed to each room with a playback device, rooms can be grouped together for synchronous playback, or the same song can be heard in all rooms synchronously.

Given the ever growing interest in digital media, there continues to be a need to develop consumer-accessible technologies to further enhance the listening experience.

BRIEF DESCRIPTION OF THE DRAWINGS

Features, aspects, and advantages of the presently disclosed technology may be better understood with regard to the following description, appended claims, and accompanying drawings where:

Figure 1:
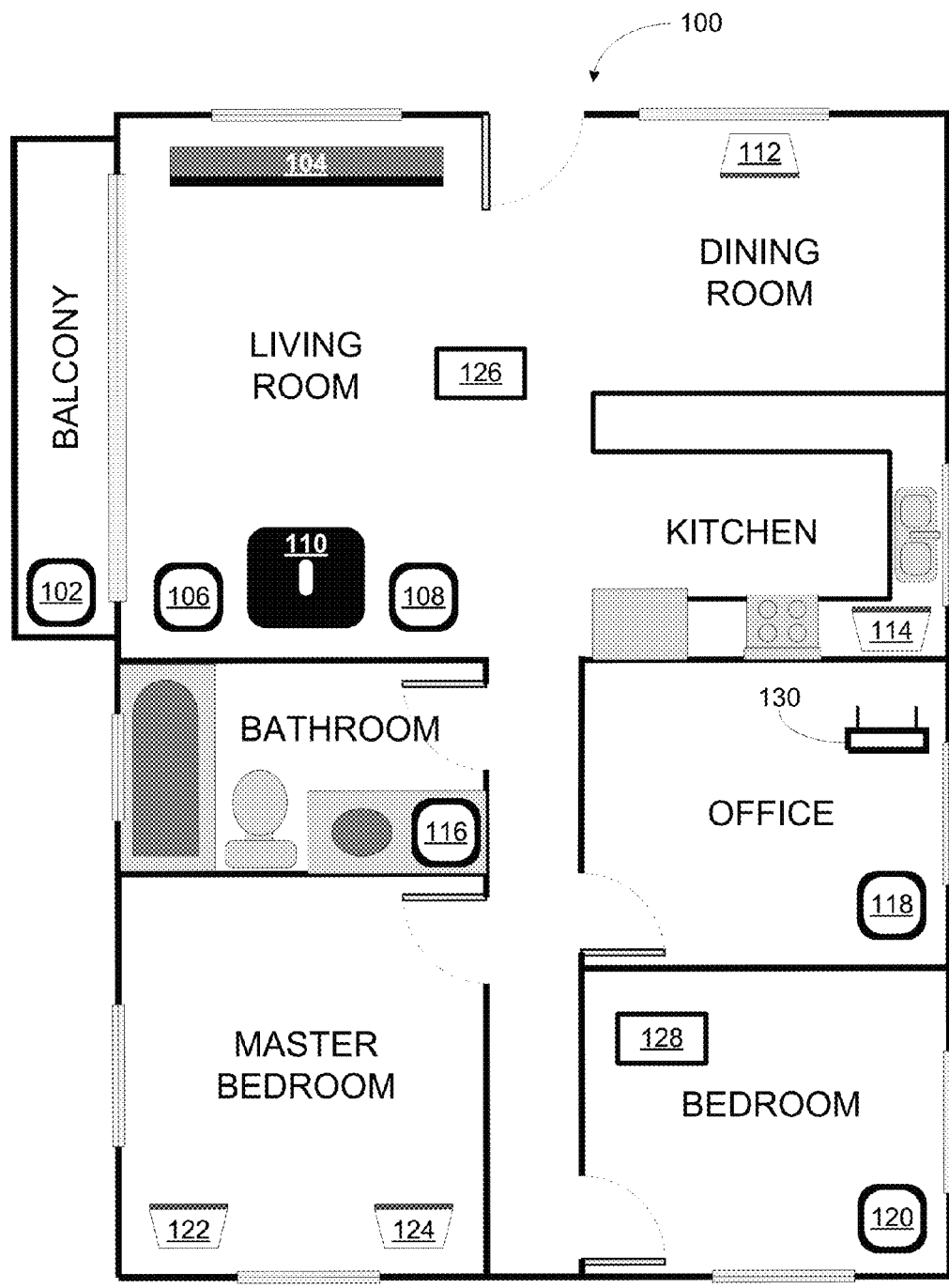
FIG. 1 shows an example media playback system configuration in which certain embodiments may be practiced.

The drawings are for the purpose of illustrating example embodiments, but it is understood that the inventions are not limited to the arrangements and instrumentality shown in the drawings.

DETAILED DESCRIPTION

I. Overview

Embodiments described herein involve balancing of outputs from playback devices playing audio content in synchrony. The playback devices may be two or more playback devices of a media playback system that have been configured as a synchrony group (two or more playback devices configured to play audio content in synchrony), stereo paired playback devices, a consolidated player, or any combination thereof. Discussions of example media playback systems, example playback devices, and example configurations of playback devices of the media playback system may be found below in sections II.a.-II.d.

Typically, playback devices of the media system have acoustic limits. Acoustic limits of a playback device may be generally described as a maximum playback volume of the playback device before the acoustic output quality of the playback device begins to deteriorate. The acoustic limit of a playback device may vary over an audio playback frequency range of the playback device. In discussions herein, an acoustic limit of a playback device may also account for electric limits or other operational limits of the playback device. Accordingly, a limiter may be implemented on the playback device to attenuate input signals above a playback volume threshold such that the output of the playback device is capped at a certain volume level, thereby improving the acoustic output quality of the playback device. In one example, an amplifier gain control of the playback device may be implemented as the limiter. In such a case, a gain value of the playback device may be capped such that an input signal is not amplified beyond the playback volume threshold of the playback device. The limiter may be a dynamic limiter such that the gain value cap may be dynamically adjusted according to amplitudes of the input audio signal. Other example limiter implementations may also be possible.

In one example configuration for audio content playback, two playback devices may be configured as a stereo pair. In one case, the playback devices of a stereo pair may have different acoustic limits, and may therefore have different limiters implemented thereon. For instance, a left channel playback device of the stereo pair may have a higher playback volume threshold than a right channel playback device of the stereo pair. This may be, for example, because the left channel playback device and the right channel playback device have different audio amplifier and/or different transducer configurations and specifications. As a result of the different limiters, the output volume from the left channel playback device and the right channel playback device may become mismatched when a playback volume of the stereo pair is beyond the playback volume threshold one of the respective playback devices. In some cases, even if the left channel playback device and the right channel playback device have the same (or substantially the same) audio amplifier and transducer configurations and specifications (i.e. the playback devices are the same production model), and therefore having comparable acoustic limits and limiters implemented thereon, the left and right channel audio components of audio content to be rendered by the stereo pair may be sufficiently mismatched in volume such that one of the playback devices may still reach a limit before the other playback device.

In one example embodiment of the present application, the left channel playback device of the two stereo paired playback devices may be configured to receive both the left channel audio component and the right channel audio component. In one case, the left channel playback device may have access to the limiter for the right channel playback device. As such, the left channel playback device may apply the limiter for the right channel playback device to the right channel audio component. The left channel playback device may then determine a limiter based on a result of applying the right channel playback device limiter to the right channel audio component. In this case, the determined limiter may correlate to the acoustic limit of the right channel playback device. As such, the left channel playback device may apply the determined limiter when playing the left channel audio component while the right channel playback device renders the right channel audio component to achieve a balanced output from the stereo pair.

In another example audio content playback configuration, playback devices of a consolidated player may have different acoustic limits, and may therefore have different limiters implemented thereon. In one case, the consolidated player may include a mid-high frequency range playback device configured to render a mid-high frequency range audio component, and a low frequency range playback device (i.e. a subwoofer) configured to render a low frequency audio component. The mid-high frequency range audio component may have a first crossover frequency and the low frequency audio component may have a second crossover frequency. In some cases, the first and second crossover frequencies may be the same frequency.

In this example, the low frequency range playback device may have a higher acoustic limit than an acoustic limit of the mid-high frequency range playback device. Accordingly, the low frequency range playback device may have a playback volume threshold higher than that of the mid-high frequency range playback device. As a result of the different limiters, the low frequency output volume of the consolidated player and the mid-high frequency output volume of the consolidated player may become mismatched when the playback volume of the consolidated player is beyond the playback volume threshold of the mid-high frequency range playback device.

In one example embodiment of the present application, one or more of the playback devices of the consolidated player may receive a plurality of audio components, including audio components to be rendered by the playback device as well as audio components to be rendered by a different playback device. As one example, the low frequency range playback device may be configured to receive the low frequency audio component to be rendered by the low frequency range playback device as well as the mid-high frequency audio component to be rendered by the mid-high frequency range playback device. In one case, the low frequency range playback device may have access to the limiter for the mid-high frequency range playback device. As such, the low frequency range playback device may apply the limiter for the mid-high frequency range playback device to the mid-high frequency audio component to determine a first limiting result, and apply the limiter for the low frequency range playback device to the low frequency audio component to determine a second limiting result. In one example, determining the first limiting result may involve generating a model limited mid-high frequency audio signal by applying the limiter for the mid-high frequency range playback device to the mid-high frequency audio component. Similarly, determining the second limiting result may involve generating a model limited low frequency audio signal by applying the limiter for the low frequency range playback device to the low frequency audio component.

Based on the first and second limiting results, the low frequency range audio playback device may determine a limiter to apply to the low frequency audio component when rendering the low frequency audio component in synchrony with playback of the mid-high frequency audio component by the mid-high frequency range playback device as a consolidated player to achieve a balanced output across the audio frequency spectrum.

In another example embodiment, the acoustic limit of the mid-high frequency range playback device of a consolidated player may be lower towards the lower end of the mid-high frequency playback range than other playback frequency ranges of the mid-high frequency range playback device. In other words, the acoustic limit towards the lower end of the mid-high frequency playback range may become the limiting factor when applying the limiter of the mid-high frequency range playback device to the mid-high frequency audio component.

In such a scenario, if the low-frequency range playback device of the consolidated player is capable of playing frequencies in the lower end of the mid-high frequency playback range of the mid-high frequency range playback device at a higher acoustic limit, the crossover frequency for playing the low-frequency audio signal on the low-frequency range playback device may be shifted to a higher frequency. Also, the crossover frequency for playing the mid-high frequency audio signal on the mid-high frequency range playback device may also be shifted to a higher frequency. In other words, audio content within a frequency range towards the lower end of the mid-high frequency playback range may be played by the low frequency range playback device, rather than the mid-high frequency range playback device. Accordingly, in some cases, applying the limiter for the mid-high frequency range playback device to the modified mid-high frequency component may result in a less limited playback of the mid-high frequency audio component by the mid-high frequency range playback device, and the balanced output of the consolidated player may have a higher volume.

While the above example embodiments generally involve two playback devices as a either a stereo pair or consolidated player, one having ordinary in the art will appreciate that concepts within the example embodiments may be extended to any number of playback devices in a media playback system configured as any one or more of a synchrony group, stereo paired playback devices, or a consolidated player. In addition, while the above example embodiments describe certain grouped players (e.g., a left player in a stereo pair or a low frequency-range playback device in a consolidated player) performing various functions, it should be understood that other players in the group could perform these functions as well.

As indicated above, the present application involves balancing of outputs from playback devices playing audio content in synchrony. In one aspect, a first playback device is provided. The first playback device includes a processor, and memory having stored thereon instructions executable by the processor to cause the first playback device to perform functions. The functions include receiving a first audio signal. The first playback device is configured to play the first audio signal according to a first crossover frequency. The functions also include determining a first limiting result by applying a limiting function to a second audio signal. The second audio signal is configured for playback by a second playback device according to a second crossover frequency, and the limiting function is associated with the second playback device. The functions further include, based on the first limiting result, configuring the first playback device to play the first audio signal according to a third crossover frequency.

In another aspect, a method is provided. The method involves receiving, by a first playback device, audio content comprising a first audio signal and a second audio signal. The first playback device is configured to play the first audio signal according to a first crossover frequency in synchrony with the playback of the second audio signal according to a second crossover frequency by a second playback device. The method also involves determining a first limiting result by applying, by the first playback device, a first limiting function to the first audio signal. The first limiting function is associated with the first playback device. The method further involves determining a second limiting result by applying, by the first playback device, a second limiting function to the second audio signal. The second limiting function is associated with the second playback device. The method also involves, based on the first limiting result and the second limiting result, configuring the first playback device to play the first audio signal according to a third crossover frequency.

In yet another aspect, a non-transitory computer readable memory is provided. The non-transitory computer readable memory has stored thereon instructions executable by a computing device to cause the computing device to perform functions. The functions include receiving a first audio signal. The first playback device is configured to play the first audio signal according to a first crossover frequency. The functions also include determining a first limiting result by applying a limiting function to a second audio signal. The second audio signal is configured for playback by a second playback device according to a second crossover frequency, and the limiting function is associated with the second playback device. The functions further include, based on the first limiting result, configuring the first playback device to play the first audio signal according to a third crossover frequency.

It will be understood by one of ordinary skill in the art that this disclosure includes numerous other embodiments.

II. Example Operating Environment

FIG. 1 shows an example configuration of a media playback system 100 in which one or more embodiments disclosed herein may be practiced or implemented. The media playback system 100 as shown is associated with an example home environment having several rooms and spaces, such as for example, a master bedroom, an office, a dining room, and a living room. As shown in the example of FIG. 1, the media playback system 100 includes playback devices 102-124, control devices 126 and 128, and a wired or wireless network router 130.

Further discussions relating to the different components of the example media playback system 100 and how the different components may interact to provide a user with a media experience may be found in the following sections. While discussions herein may generally refer to the example media playback system 100, technologies described herein are not limited to applications within, among other things, the home environment as shown in FIG. 1. For instance, the technologies described herein may be useful in environments where multi-zone audio may be desired, such as, for example, a commercial setting like a restaurant, mall or airport, a vehicle like a sports utility vehicle (SUV), bus or car, a ship or boat, an airplane, and so on.

a. Example Playback Devices

Figure 2:
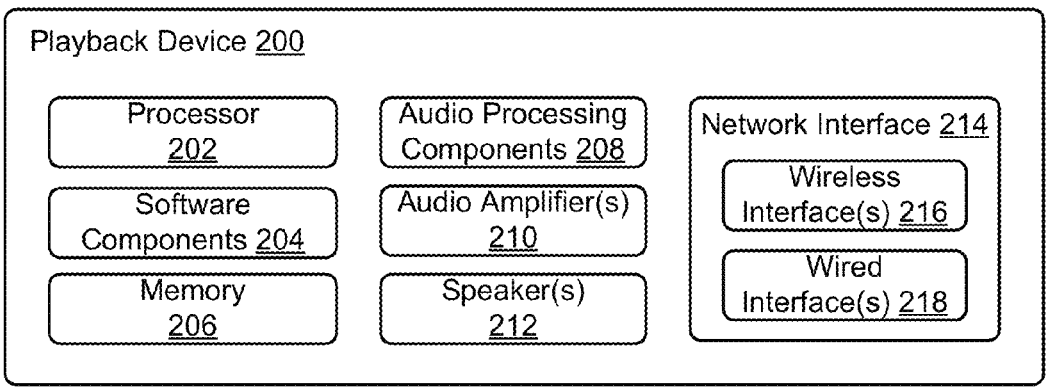
FIG. 2 shows a functional block diagram of an example playback device.

FIG. 2 shows a functional block diagram of an example playback device 200 that may be configured to be one or more of the playback devices 102-124 of the media playback system 100 of FIG. 1. The playback device 200 may include a processor 202, software components 204, memory 206, audio processing components 208, audio amplifier(s) 210, speaker(s) 212, and a network interface 214 including wireless interface(s) 216 and wired interface(s) 218. In one case, the playback device 200 may not include the speaker(s) 212, but rather a speaker interface for connecting the playback device 200 to external speakers. In another case, the playback device 200 may include neither the speaker(s) 212 nor the audio amplifier(s) 210, but rather an audio interface for connecting the playback device 200 to an external audio amplifier or audio-visual receiver.

In one example, the processor 202 may be a clock-driven computing component configured to process input data according to instructions stored in the memory 206. The memory 206 may be a tangible computer-readable medium configured to store instructions executable by the processor 202. For instance, the memory 206 may be data storage that can be loaded with one or more of the software components 204 executable by the processor 202 to achieve certain functions. In one example, the functions may involve the playback device 200 retrieving audio data from an audio source or another playback device. In another example, the functions may involve the playback device 200 sending audio data to another device or playback device on a network. In yet another example, the functions may involve pairing of the playback device 200 with one or more playback devices to create a multi-channel audio environment.

Certain functions may involve the playback device 200 synchronizing playback of audio content with one or more other playback devices. During synchronous playback, a listener will preferably not be able to perceive time-delay differences between playback of the audio content by the playback device 200 and the one or more other playback devices. U.S. Pat. No. 8,234,395 entitled, "System and method for synchronizing operations among a plurality of independently clocked digital data processing devices," which is hereby incorporated by reference, provides in more detail some examples for audio playback synchronization among playback devices.

The memory 206 may further be configured to store data associated with the playback device 200, such as one or more zones and/or zone groups the playback device 200 is a part of, audio sources accessible by the playback device 200, or a playback queue that the playback device 200 (or some other playback device) may be associated with. The data may be stored as one or more state variables that are periodically updated and used to describe the state of the playback device 200. The memory 206 may also include the data associated with the state of the other devices of the media system, and shared from time to time among the devices so that one or more of the devices have the most recent data associated with the system. Other embodiments are also possible.

The audio processing components 208 may include one or more digital-to-analog converters (DAC), an audio preprocessing component, an audio enhancement component or a digital signal processor (DSP), and so on. In one embodiment, one or more of the audio processing components 208 may be a subcomponent of the processor 202. In one example, audio content may be processed and/or intentionally altered by the audio processing components 208 to produce audio signals. The produced audio signals may then be provided to the audio amplifier(s) 210 for amplification and playback through speaker(s) 212. Particularly, the audio amplifier(s) 210 may include devices configured to amplify audio signals to a level for driving one or more of the speakers 212. The speaker(s) 212 may include an individual transducer (e.g., a "driver") or a complete speaker system involving an enclosure with one or more drivers. A particular driver of the speaker(s) 212 may include, for example, a subwoofer (e.g., for low frequencies), a mid-range driver (e.g., for middle frequencies), and/or a tweeter (e.g., for high frequencies). In some cases, each transducer in the one or more speakers 212 may be driven by an individual corresponding audio amplifier of the audio amplifier(s) 210. In addition to producing analog signals for playback by the playback device 200, the audio processing components 208 may be configured to process audio content to be sent to one or more other playback devices for playback.

Audio content to be processed and/or played back by the playback device 200 may be received from an external source, such as via an audio line-in input connection (e.g., an auto-detecting 3.5 mm audio line-in connection) or the network interface 214.

The network interface 214 may be configured to facilitate a data flow between the playback device 200 and one or more other devices on a data network. As such, the playback device 200 may be configured to receive audio content over the data network from one or more other playback devices in communication with the playback device 200, network devices within a local area network, or audio content sources over a wide area network such as the Internet. In one example, the audio content and other signals transmitted and received by the playback device 200 may be transmitted in the form of digital packet data containing an Internet Protocol (IP)-based source address and IP-based destination addresses. In such a case, the network interface 214 may be configured to parse the digital packet data such that the data destined for the playback device 200 is properly received and processed by the playback device 200.

As shown, the network interface 214 may include wireless interface(s) 216 and wired interface(s) 218. The wireless interface(s) 216 may provide network interface functions for the playback device 200 to wirelessly communicate with other devices (e.g., other playback device(s), speaker(s), receiver(s), network device(s), control device(s) within a data network the playback device 200 is associated with) in accordance with a communication protocol (e.g., any wireless standard including IEEE 802.11a, 802.11b, 802.11g, 802.11n, 802.11ac, 802.15, 4G mobile communication standard, and so on). The wired interface(s) 218 may provide network interface functions for the playback device 200 to communicate over a wired connection with other devices in accordance with a communication protocol (e.g., IEEE 802.3). While the network interface 214 shown in FIG. 2 includes both wireless interface(s) 216 and wired interface(s) 218, the network interface 214 may in some embodiments include only wireless interface(s) or only wired interface(s).

In one example, the playback device 200 and one other playback device may be paired to play two separate audio components of audio content. For instance, playback device 200 may be configured to play a left channel audio component, while the other playback device may be configured to play a right channel audio component, thereby producing or enhancing a stereo effect of the audio content. The paired playback devices (also referred to as "bonded playback devices") may further play audio content in synchrony with other playback devices.

In another example, the playback device 200 may be sonically consolidated with one or more other playback devices to form a single, consolidated playback device. A consolidated playback device may be configured to process and reproduce sound differently than an unconsolidated playback device or playback devices that are paired, because a consolidated playback device may have additional speaker drivers through which audio content may be rendered. For instance, if the playback device 200 is a playback device designed to render low frequency range audio content (i.e. a subwoofer), the playback device 200 may be consolidated with a playback device designed to render full frequency range audio content. In such a case, the full frequency range playback device, when consolidated with the low frequency playback device 200, may be configured to render only the mid and high frequency components of audio content, while the low frequency range playback device 200 renders the low frequency component of the audio content. The consolidated playback device may further be paired with a single playback device or yet another consolidated playback device.

By way of illustration, SONOS, Inc. presently offers (or has offered) for sale certain playback devices including a "PLAY:1," "PLAY:3," "PLAY:5," "PLAYBAR," "CONNECT:AMP," "CONNECT," and "SUB." Any other past, present, and/or future playback devices may additionally or alternatively be used to implement the playback devices of example embodiments disclosed herein. Additionally, it is understood that a playback device is not limited to the example illustrated in FIG. 2 or to the SONOS product offerings. For example, a playback device may include a wired or wireless headphone. In another example, a playback device may include or interact with a docking station for personal mobile media playback devices. In yet another example, a playback device may be integral to another device or component such as a television, a lighting fixture, or some other device for indoor or outdoor use.

b. Example Playback Zone Configurations

Referring back to the media playback system 100 of FIG. 1, the environment may have one or more playback zones, each with one or more playback devices. The media playback system 100 may be established with one or more playback zones, after which one or more zones may be added, or removed to arrive at the example configuration shown in FIG. 1. Each zone may be given a name according to a different room or space such as an office, bathroom, master bedroom, bedroom, kitchen, dining room, living room, and/or balcony. In one case, a single playback zone may include multiple rooms or spaces. In another case, a single room or space may include multiple playback zones.

As shown in FIG. 1, the balcony, dining room, kitchen, bathroom, office, and bedroom zones each have one playback device, while the living room and master bedroom zones each have multiple playback devices. In the living room zone, playback devices 104, 106, 108, and 110 may be configured to play audio content in synchrony as individual playback devices, as one or more bonded playback devices, as one or more consolidated playback devices, or any combination thereof. Similarly, in the case of the master bedroom, playback devices 122 and 124 may be configured to play audio content in synchrony as individual playback devices, as a bonded playback device, or as a consolidated playback device.

In one example, one or more playback zones in the environment of FIG. 1 may each be playing different audio content. For instance, the user may be grilling in the balcony zone and listening to hip hop music being played by the playback device 102 while another user may be preparing food in the kitchen zone and listening to classical music being played by the playback device 114. In another example, a playback zone may play the same audio content in synchrony with another playback zone. For instance, the user may be in the office zone where the playback device 118 is playing the same rock music that is being playing by playback device 102 in the balcony zone. In such a case, playback devices 102 and 118 may be playing the rock music in synchrony such that the user may seamlessly (or at least substantially seamlessly) enjoy the audio content that is being played out-loud while moving between different playback zones. Synchronization among playback zones may be achieved in a manner similar to that of synchronization among playback devices, as described in previously referenced U.S. Pat. No. 8,234,395.

As suggested above, the zone configurations of the media playback system 100 may be dynamically modified, and in some embodiments, the media playback system 100 supports numerous configurations. For instance, if a user physically moves one or more playback devices to or from a zone, the media playback system 100 may be reconfigured to accommodate the change(s). For instance, if the user physically moves the playback device 102 from the balcony zone to the office zone, the office zone may now include both the playback device 118 and the playback device 102. The playback device 102 may be paired or grouped with the office zone and/or renamed if so desired via a control device such as the control devices 126 and 128. On the other hand, if the one or more playback devices are moved to a particular area in the home environment that is not already a playback zone, a new playback zone may be created for the particular area.

Further, different playback zones of the media playback system 100 may be dynamically combined into zone groups or split up into individual playback zones. For instance, the dining room zone and the kitchen zone 114 may be combined into a zone group for a dinner party such that playback devices 112 and 114 may render audio content in synchrony. On the other hand, the living room zone may be split into a television zone including playback device 104, and a listening zone including playback devices 106, 108, and 110, if the user wishes to listen to music in the living room space while another user wishes to watch television.

c. Example Control Devices

Figure 3:
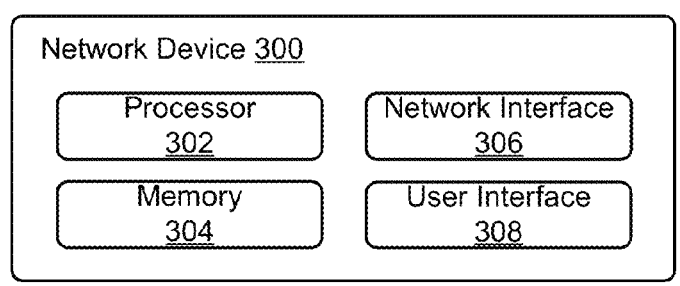
FIG. 3 shows a functional block diagram of an example control device.

FIG. 3 shows a functional block diagram of an example control device 300 that may be configured to be one or both of the control devices 126 and 128 of the media playback system 100. As shown, the control device 300 may include a processor 302, memory 304, a network interface 306, and a user interface 308. In one example, the control device 300 may be a dedicated controller for the media playback system 100. In another example, the control device 300 may be a network device on which media playback system controller application software may be installed, such as for example, an iPhone™, iPad™ or any other smart phone, tablet or network device (e.g., a networked computer such as a PC or Mac™).

The processor 302 may be configured to perform functions relevant to facilitating user access, control, and configuration of the media playback system 100. The memory 304 may be configured to store instructions executable by the processor 302 to perform those functions. The memory 304 may also be configured to store the media playback system controller application software and other data associated with the media playback system 100 and the user.

In one example, the network interface 306 may be based on an industry standard (e.g., infrared, radio, wired standards including IEEE 802.3, wireless standards including IEEE 802.11a, 802.11b, 802.11g, 802.11n, 802.11ac, 802.15, 4G mobile communication standard, and so on). The network interface 306 may provide a means for the control device 300 to communicate with other devices in the media playback system 100. In one example, data and information (e.g., such as a state variable) may be communicated between control device 300 and other devices via the network interface 306. For instance, playback zone and zone group configurations in the media playback system 100 may be received by the control device 300 from a playback device or another network device, or transmitted by the control device 300 to another playback device or network device via the network interface 306. In some cases, the other network device may be another control device.

Playback device control commands such as volume control and audio playback control may also be communicated from the control device 300 to a playback device via the network interface 306. As suggested above, changes to configurations of the media playback system 100 may also be performed by a user using the control device 300. The configuration changes may include adding/removing one or more playback devices to/from a zone, adding/removing one or more zones to/from a zone group, forming a bonded or consolidated player, separating one or more playback devices from a bonded or consolidated player, among others. Accordingly, the control device 300 may sometimes be referred to as a controller, whether the control device 300 is a dedicated controller or a network device on which media playback system controller application software is installed.

Figure 4:
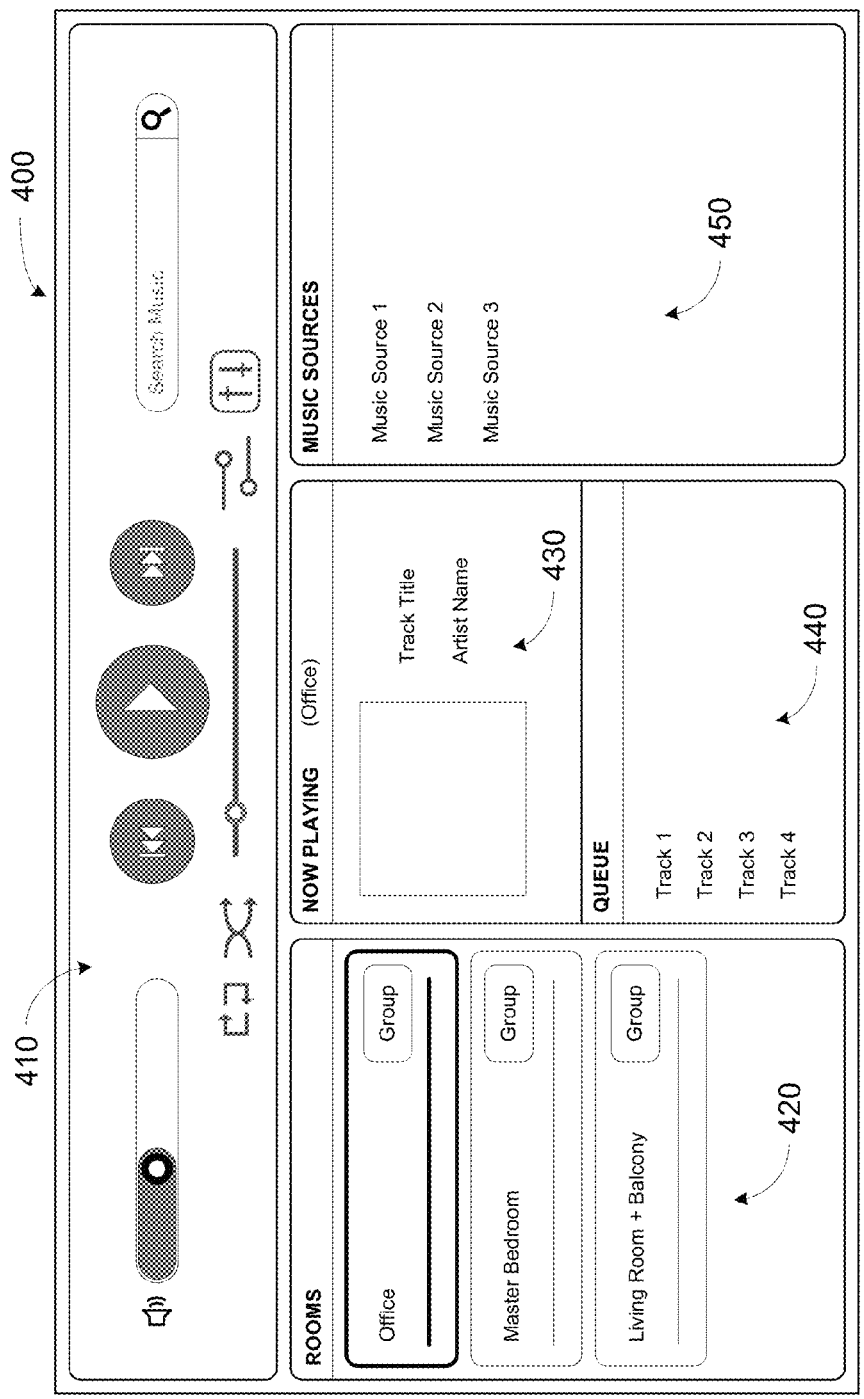
FIG. 4 shows an example controller interface.

The user interface 308 of the control device 300 may be configured to facilitate user access and control of the media playback system 100, by providing a controller interface such as the controller interface 400 shown in FIG. 4. The controller interface 400 includes a playback control region 410, a playback zone region 420, a playback status region 430, a playback queue region 440, and an audio content sources region 450. The user interface 400 as shown is just one example of a user interface that may be provided on a network device such as the control device 300 of FIG. 3 (and/or the control devices 126 and 128 of FIG. 1) and accessed by users to control a media playback system such as the media playback system 100. Other user interfaces of varying formats, styles, and interactive sequences may alternatively be implemented on one or more network devices to provide comparable control access to a media playback system.

The playback control region 410 may include selectable (e.g., by way of touch or by using a cursor) icons to cause playback devices in a selected playback zone or zone group to play or pause, fast forward, rewind, skip to next, skip to previous, enter/exit shuffle mode, enter/exit repeat mode, enter/exit cross fade mode. The playback control region 410 may also include selectable icons to modify equalization settings, and playback volume, among other possibilities.

The playback zone region 420 may include representations of playback zones within the media playback system 100. In some embodiments, the graphical representations of playback zones may be selectable to bring up additional selectable icons to manage or configure the playback zones in the media playback system, such as a creation of bonded zones, creation of zone groups, separation of zone groups, and renaming of zone groups, among other possibilities.

For example, as shown, a "group" icon may be provided within each of the graphical representations of playback zones. The "group" icon provided within a graphical representation of a particular zone may be selectable to bring up options to select one or more other zones in the media playback system to be grouped with the particular zone. Once grouped, playback devices in the zones that have been grouped with the particular zone will be configured to play audio content in synchrony with the playback device(s) in the particular zone. Analogously, a "group" icon may be provided within a graphical representation of a zone group. In this case, the "group" icon may be selectable to bring up options to deselect one or more zones in the zone group to be removed from the zone group. Other interactions and implementations for grouping and ungrouping zones via a user interface such as the user interface 400 are also possible. The representations of playback zones in the playback zone region 420 may be dynamically updated as playback zone or zone group configurations are modified.

The playback status region 430 may include graphical representations of audio content that is presently being played, previously played, or scheduled to play next in the selected playback zone or zone group. The selected playback zone or zone group may be visually distinguished on the user interface, such as within the playback zone region 420 and/or the playback status region 430. The graphical representations may include track title, artist name, album name, album year, track length, and other relevant information that may be useful for the user to know when controlling the media playback system via the user interface 400.

The playback queue region 440 may include graphical representations of audio content in a playback queue associated with the selected playback zone or zone group. In some embodiments, each playback zone or zone group may be associated with a playback queue containing information corresponding to zero or more audio items for playback by the playback zone or zone group. For instance, each audio item in the playback queue may comprise a uniform resource identifier (URI), a uniform resource locator (URL) or some other identifier that may be used by a playback device in the playback zone or zone group to find and/or retrieve the audio item from a local audio content source or a networked audio content source, possibly for playback by the playback device.

In one example, a playlist may be added to a playback queue, in which case information corresponding to each audio item in the playlist may be added to the playback queue. In another example, audio items in a playback queue may be saved as a playlist. In a further example, a playback queue may be empty, or populated but "not in use" when the playback zone or zone group is playing continuously streaming audio content, such as Internet radio that may continue to play until otherwise stopped, rather than discrete audio items that have playback durations. In an alternative embodiment, a playback queue can include Internet radio and/or other streaming audio content items and be "in use" when the playback zone or zone group is playing those items. Other examples are also possible.

When playback zones or zone groups are "grouped" or "ungrouped," playback queues associated with the affected playback zones or zone groups may be cleared or re-associated. For example, if a first playback zone including a first playback queue is grouped with a second playback zone including a second playback queue, the established zone group may have an associated playback queue that is initially empty, that contains audio items from the first playback queue (such as if the second playback zone was added to the first playback zone), that contains audio items from the second playback queue (such as if the first playback zone was added to the second playback zone), or a combination of audio items from both the first and second playback queues. Subsequently, if the established zone group is ungrouped, the resulting first playback zone may be re-associated with the previous first playback queue, or be associated with a new playback queue that is empty or contains audio items from the playback queue associated with the established zone group before the established zone group was ungrouped. Similarly, the resulting second playback zone may be re-associated with the previous second playback queue, or be associated with a new playback queue that is empty, or contains audio items from the playback queue associated with the established zone group before the established zone group was ungrouped. Other examples are also possible.

Referring back to the user interface 400 of FIG. 4, the graphical representations of audio content in the playback queue region 440 may include track titles, artist names, track lengths, and other relevant information associated with the audio content in the playback queue. In one example, graphical representations of audio content may be selectable to bring up additional selectable icons to manage and/or manipulate the playback queue and/or audio content represented in the playback queue. For instance, a represented audio content may be removed from the playback queue, moved to a different position within the playback queue, or selected to be played immediately, or after any currently playing audio content, among other possibilities. A playback queue associated with a playback zone or zone group may be stored in a memory on one or more playback devices in the playback zone or zone group, on a playback device that is not in the playback zone or zone group, and/or some other designated device.

The audio content sources region 450 may include graphical representations of selectable audio content sources from which audio content may be retrieved and played by the selected playback zone or zone group. Discussions pertaining to audio content sources may be found in the following section.

d. Example Audio Content Sources

As indicated previously, one or more playback devices in a zone or zone group may be configured to retrieve for playback audio content (e.g. according to a corresponding URI or URL for the audio content) from a variety of available audio content sources. In one example, audio content may be retrieved by a playback device directly from a corresponding audio content source (e.g., a line-in connection). In another example, audio content may be provided to a playback device over a network via one or more other playback devices or network devices.

Example audio content sources may include a memory of one or more playback devices in a media playback system such as the media playback system 100 of FIG. 1, local music libraries on one or more network devices (such as a control device, a network-enabled personal computer, or a networked-attached storage (NAS), for example), streaming audio services providing audio content via the Internet (e.g., the cloud), or audio sources connected to the media playback system via a line-in input connection on a playback device or network devise, among other possibilities.

In some embodiments, audio content sources may be regularly added or removed from a media playback system such as the media playback system 100 of FIG. 1. In one example, an indexing of audio items may be performed whenever one or more audio content sources are added, removed or updated. Indexing of audio items may involve scanning for identifiable audio items in all folders/directory shared over a network accessible by playback devices in the media playback system, and generating or updating an audio content database containing metadata (e.g., title, artist, album, track length, among others) and other associated information, such as a URI or URL for each identifiable audio item found. Other examples for managing and maintaining audio content sources may also be possible.

The above discussions relating to playback devices, controller devices, playback zone configurations, and media content sources provide only some examples of operating environments within which functions and methods described below may be implemented. Other operating environments and configurations of media playback systems, playback devices, and network devices not explicitly described herein may also be applicable and suitable for implementation of the functions and methods.

III. Example Methods for Audio Output Balancing During Synchronized Playback

As discussed above, embodiments described herein may involve balancing of outputs from playback devices playing audio content in synchrony.

a. First Example Method for Audio Output Balancing During Synchronized Playback

Figure 5:
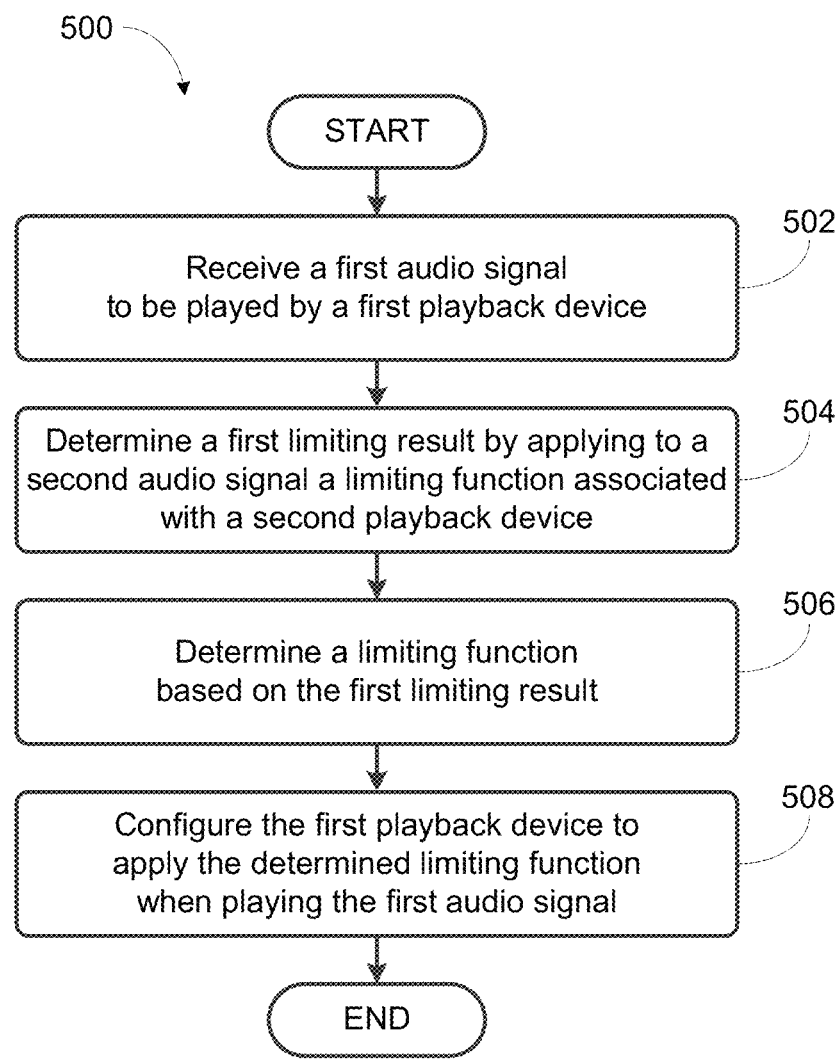
FIG. 5 shows a flow diagram of a first example method for audio output balancing during synchronized playback.

FIG. 5 shows a flow diagram of a first example method for audio output balancing during synchronized playback. Method 500 shown in FIG. 5 presents an embodiment of a method that can be implemented within an operating environment involving, for example, the media playback system 100 of FIG. 1, one or more of the playback device 200 of FIG. 2, and one or more of the control device 300 of FIG. 3. Method 500 may include one or more operations, functions, or actions as illustrated by one or more of blocks 502-508. Although the blocks are illustrated in sequential order, these blocks may also be performed in parallel, and/or in a different order than those described herein. Also, the various blocks may be combined into fewer blocks, divided into additional blocks, and/or removed based upon the desired implementation.

In addition, for the method 500 and other processes and methods disclosed herein, the flowchart shows functionality and operation of one possible implementation of present embodiments. In this regard, each block may represent a module, a segment, or a portion of program code, which includes one or more instructions executable by a processor for implementing specific logical functions or steps in the process. The program code may be stored on any type of computer readable medium, for example, such as a storage device including a disk or hard drive. The computer readable medium may include non-transitory computer readable medium, for example, such as computer-readable media that stores data for short periods of time like register memory, processor cache and Random Access Memory (RAM). The computer readable medium may also include non-transitory media, such as secondary or persistent long term storage, like read only memory (ROM), optical or magnetic disks, compact-disc read only memory (CD-ROM), for example. The computer readable media may also be any other volatile or non-volatile storage systems. The computer readable medium may be considered a computer readable storage medium, for example, or a tangible storage device. In addition, for the method 500 and other processes and methods disclosed herein, each block in FIG. 5 may represent circuitry that is wired to perform the specific logical functions in the process.

Figure 6A:
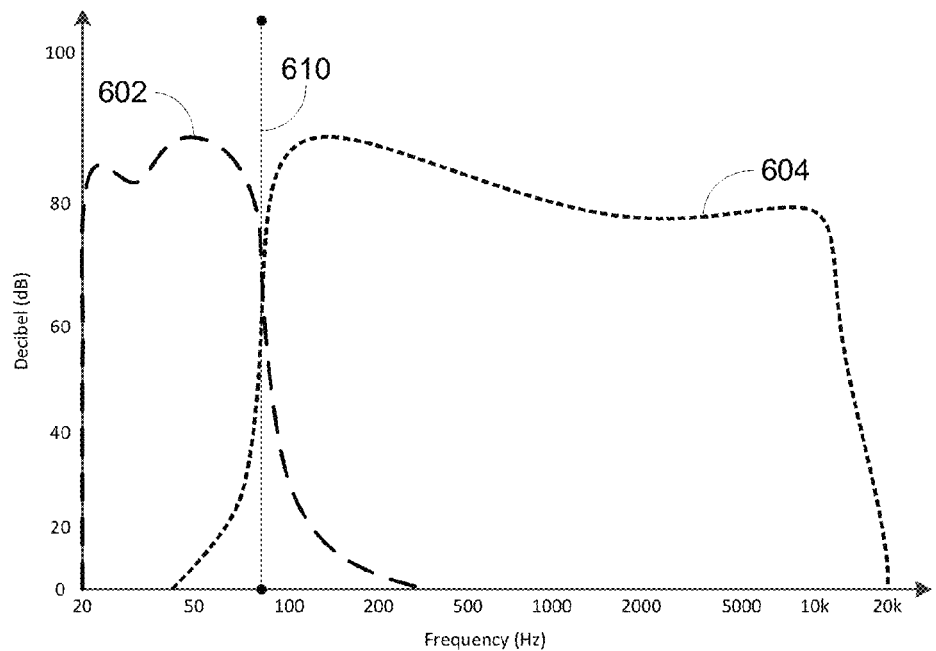
FIGS. 6A, 6B, 6C, and 6D show example synchronized playback audio signals, example audio limiters, and example limited audio signals.

At block 502, the method 500 involves receiving a first audio signal to be played by a first playback device. In one example, the first playback device may be configured to play the first audio signal in synchrony with the playback of a second audio signal by a second playback device. FIG. 6A shows a first example pair of synchronized playback audio signals 602 and 604. In this example, audio signal 602 may be the first audio signal and may include audio content within a first example frequency range of approximately 20 Hz to 80 Hz. As such, a crossover frequency for audio signal 602 may be 80 Hz. Audio signal 604 may be the second audio signal and may include audio content with a second example frequency range of approximately 80 Hz to 20 kHz. In this example, audio signal 602 may also have a crossover frequency of 80 Hz.

In this case, the first and second playback devices may be configured as a consolidated player, and the audio signal 602 may be the first audio signal to be played by the first playback device while the audio signal 604 may be the second audio signal to be played by the second playback device. In such a case, the first playback device may be a playback device configured for playing low frequency audio content (i.e., a subwoofer), and the second playback device may be a playback device configured to play a full frequency range or mid-high frequency range of audio content. For purposes of illustration, the first and second playback devices may be playback devices 104 and 110, respectively, as shown in FIG. 1.

Figure 6B:
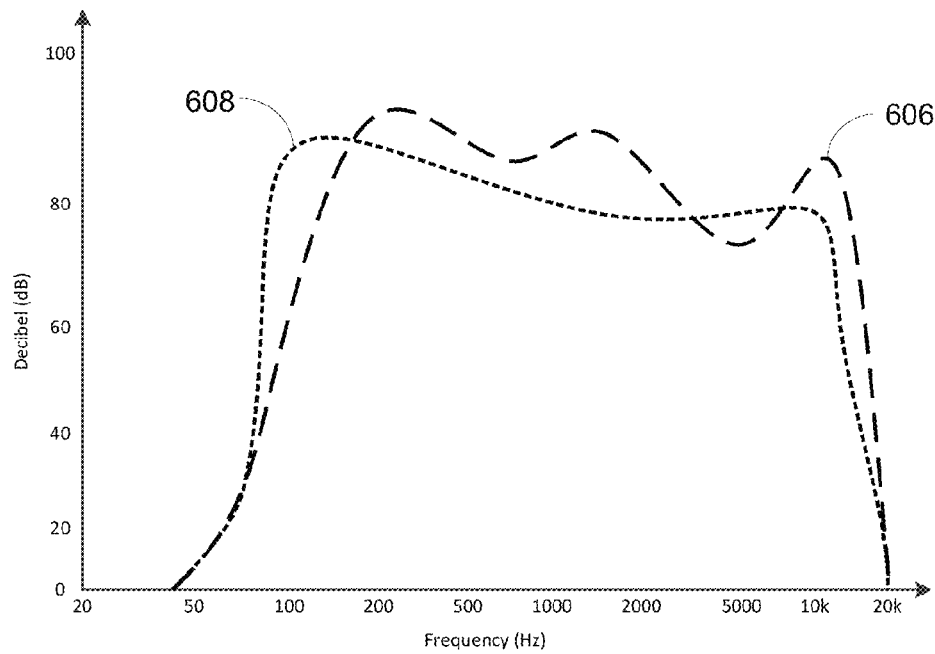

FIG. 6B shows a second example pair of synchronized playback audio signals 606 and 608. In this example, audio signal 608 may be the first audio signal and may include left channel components of a stereo audio content, while audio signal 606 may be the second audio signal and may include right channel components of the stereo audio content. In this case, the first and second playback devices may be configured as a stereo pair such that the first playback device is configured as a left channel speaker for playing the audio signal 608 while the second playback device is configured as a right channel speaker for playing the audio signal 606. For purposes of illustration, the first and second playback devices in this case may be the playback devices 124 and 122, respectively, as shown in FIG. 1.

In one case, the first playback device in the consolidated player or stereo pair may be a primary player configured to receive audio signals and send the audio signals to other playback devices within the consolidated player or stereo pair for playback. As such, in one example, the first audio signal and the second audio signal may be received by the first playback device. For instance, in connection with FIG. 6A, the audio signals 602 and 604 may be received by a low frequency range playback device of the consolidated player, and in connection with FIG. 6B, the audio signals 606 and 608 may be received by the left channel speaker of the stereo pair. In another case, the first playback device may be just any playback device in the consolidated player or stereo pair. In some instances, each playback device in the consolidated player or stereo pair may receive, either directly from a content source, from the primary player, or from some other source, the audio signals (or components of the audio signals) to be rendered by the consolidated player or stereo pair.

Referring back to FIG. 5, block 504 of the method 500 involves determining a first limiting result by applying to a second audio signal a limiting function associated with a second playback device. As indicated above, the second playback device may be a full or mid-high frequency range playback device in the example in connection with FIG. 6A, or a right channel speaker in the example in connection with FIG. 6B. As previously indicated, the limiting function associated with the second playback device may represent an acoustic limit of the second playback device. As such, when applying the limiting function associated with the second playback to the second audio signal, the first playback device generates a model of an audio signal that may be rendered by the second playback device when the second playback device plays the second audio signal.

The first playback device, in order to apply the limiting function associated with the second playback device, has access to the limiting function associated with the second playback device. In one example, the first playback device may receive the limiting function associated with the second playback device when the consolidated player or stereo pair is formed. In another example, the first playback device may receive the limiting function associated with the second playback device when either the first playback device or the second playback device joins the media playback system that the first and second playback devices are parts of In one case, the limiting function associated with the second playback device may be provided to the first playback device by the second playback device. In another case, the limiting function associated with the second playback device may be provided from a local or remote network device or server.

In some instances, the limiting function associated with the second playback device may be specific to the particular second playback device. In other instances, the limiting function associated with the second playback device may be associated with a production model of the second playback device, such that all playback devices of that production model have the same limiting functions. In such instances, the first playback device may already have stored thereon a particular limiting function associated with the production model of the second playback device and may access the particular limiting function as the limiting function associated with the second playback device.

In some cases, the limiting function associated with the second playback device may be a modified version of the limiting function that the second playback device actually applies when playing audio content. For instance, the limiting function applied by the first playback device may be a simplified version of the limiting function applied by the second playback device when the second playback device is playing audio content to lessen the processing load of the first playback device when executing the block 504. Other examples of limiting functions and limiting function sources are also possible.

Figure 6C:
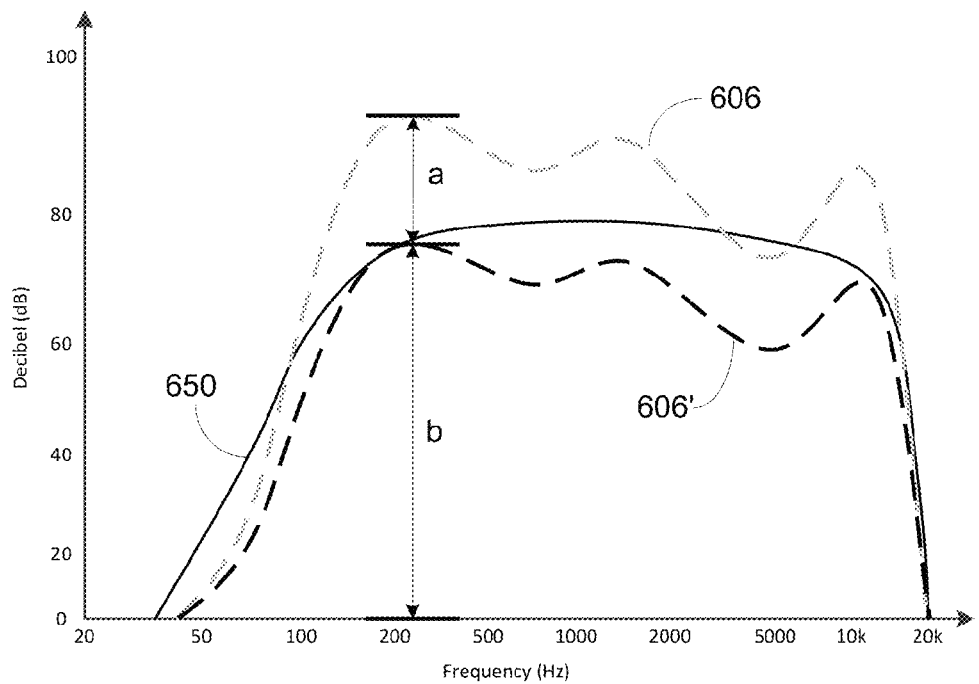

For purposes of illustration, FIG. 6C shows an example application of a limiting function 650 to the second audio signal 606 discussed previously in connection to the example of FIG. 6B. In this example, the limiting function 650 may be the limiting function associated with the second playback device, which as discussed above may be the right channel speaker of the stereo pair. As shown, applying the limiting function 650 results in a limited second audio signal 606' that is a proportionally scaled down version of the second audio signal 606 such that the limited second audio signal 606' is within the acoustic limit of the second playback device as defined by the limiting function 650, across the entire frequency range of the second audio signal 606. As shown in this illustrative example, the first limiting result may indicate that the limited second audio signal 606' is the second audio signal 606 scaled down by a ratio of b/(a+b).

In some cases, the acoustic limit of a playback device may be lower (more limited) towards the lower frequencies of the playback frequency of the playback device. In other words, the ratio by which an audio signal is scaled when applying the limiting function associated with the playback device may be dependent primarily on the lower frequencies of the audio signal. In fact, in some instance, the limiting function may only be provided for lower frequency audio signal anyway. As such, the first playback device may in some embodiments, process the second audio signal such that only the lower frequencies of the second audio signal remain (i.e. using a low-pass filter). Continuing with the examples above, the first playback device may consequently apply the limiting function 650 associated with the second playback device to just the remaining lower frequencies of the second audio signal 606 to determine the first limiting result. In some cases, applying the limiting function 650 to only the lower frequencies of the second audio signal 606 may reduce the overall processing power and processing time of block 504.

Figure 6D:
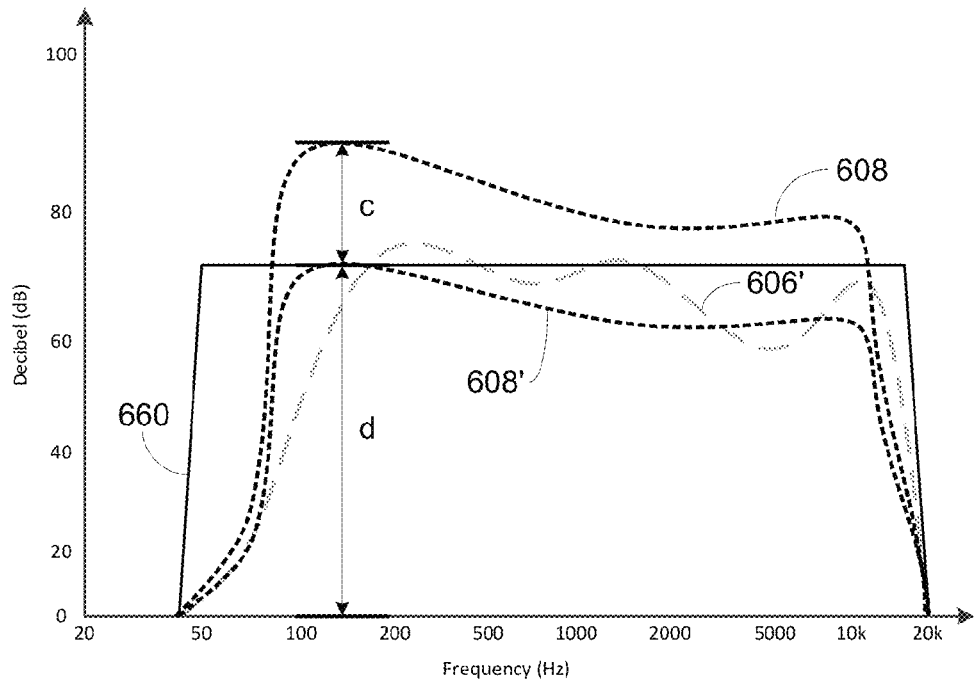

For a balanced output between the playback of the first audio signal 608 by the first playback device and playback of the second audio signal 606 by the second playback device, the first audio signal 608 may need to be limited or proportionally scaled to match that of the limited second audio signal 606' when played by the first playback device. Accordingly, at block 506, the method 500 involves determining a limiting function based on the first limiting result. FIG. 6D shows an example limiting function 660 determined based on the first limiting result discussed above. As shown, the limiting function 660, when applied, may be configured to scale the first audio signal 608 by a ratio of d/(c+d). In this case, for a balanced output between the playback of the first audio signal 608 and the second audio signal 606, $d/(c+d)=b/(a+b)$.

At block 508, the method 500 involves configuring the first playback device to apply the determined limiting function when playing the first audio signal. Referring to FIG. 6D again, the first playback device may be configured to apply the limiting function 660 when playing the first audio signal 608. As shown, a limited first audio signal 608' may be generated when applying the limiting function 660 to the first audio signal 608. The limited first audio signal 608' is proportionally scaled down from the first audio signal 608 by the ratio of d/(c+d). In one example, configuring the first playback device to apply the limiting function 660 to the first audio signal 608 may involve adjusting an amplifier gain applied to the first audio signal 608 by the first playback device. In one case, the amplifier gain may be adjusted to be d/(c+d) of unity gain. As also shown in FIG. 6D, the limited first audio signal 608' and the limited second audio signal 606' are substantially as proportionally balanced as the first audio signal 608 and second audio signal 606 shown in FIG. 6B. Accordingly, when configured to apply the determined limiting function 660, the first playback device may effectively render the limited first audio signal 608' when playing the first audio signal 608. In another example, applying the limiting function 660 to the first audio signal 608 may involve simply capping or clipping the first audio signal 608 according to the limiting function 660, rather than proportionally scaling the first audio signal 608.

In one example, as suggested previously, the first playback device may be a primary playback device in the stereo pair and as such may also be configured to cause and/or coordinate the second playback device to play the second audio signal 606 in synchrony with the playback of the first audio signal 608. In some embodiments, synchronous playback between the first and second playback devices may be performed as described in previously referenced U.S. Pat. No. 8,234,395, also assigned to SONOS, Inc.

As a primary player, the first playback device may be configured to send the second audio signal 606 to the second playback device for the second playback device to play in synchrony with the playback of the first audio signal 608 by the first playback device (while applying the determined limiting function 660). In some embodiments, if the first playback device generated the limited second audio signal 606' when applying the limiting function 650 to the second audio signal 606 to determine the first limiting result in block 504, the first playback device may send the limited second audio signal 606' to the second playback device for the second playback device to render, thereby eliminating the need for the second playback device to apply the limiting function 650 associated with the second device when playing the second audio signal 606. In other embodiments, the first playback device may simply send the audio signal 606 to the second playback device, and the playback device may apply its limiting function 650 to the audio signal 606.

While discussions above relating to the method 500 are generally directed to the balancing of audio output during synchronized playback by a stereo pair, one having ordinary skill in the art will appreciate that method 500 may be applied to other synchronized playback scenarios as well. Further, note that in some embodiments, the illustrative examples discussed in connection to the method 500 and FIG. 6A-6D represent only one instance of a dynamic balancing of audio output during synchronized playback. In other words, method 500 may be performed for each data packet or series of data packets containing audio signals received as part of a streaming audio content.

b. Second Example Method for Audio Output Balancing During Synchronized Playback In the example discussed above in connection to FIG. 5, the first playback device determines a limiting function for the first audio signal to be played by the first device based on the result of applying the limiting function associated with the second playback device to the second audio signal to be played by the second device. This may be the case when the first playback device and the second playback device have similar or comparable acoustic limits, or if the first playback device has a higher acoustic limit than the second playback device. In some cases, however, the limiting function for the first audio signal may be determined based on the result of applying the limiting function associated with the second playback device on the second audio signal as well as a result of applying the limiting function associated with the first playback device on the first audio signal.

Figure 7:
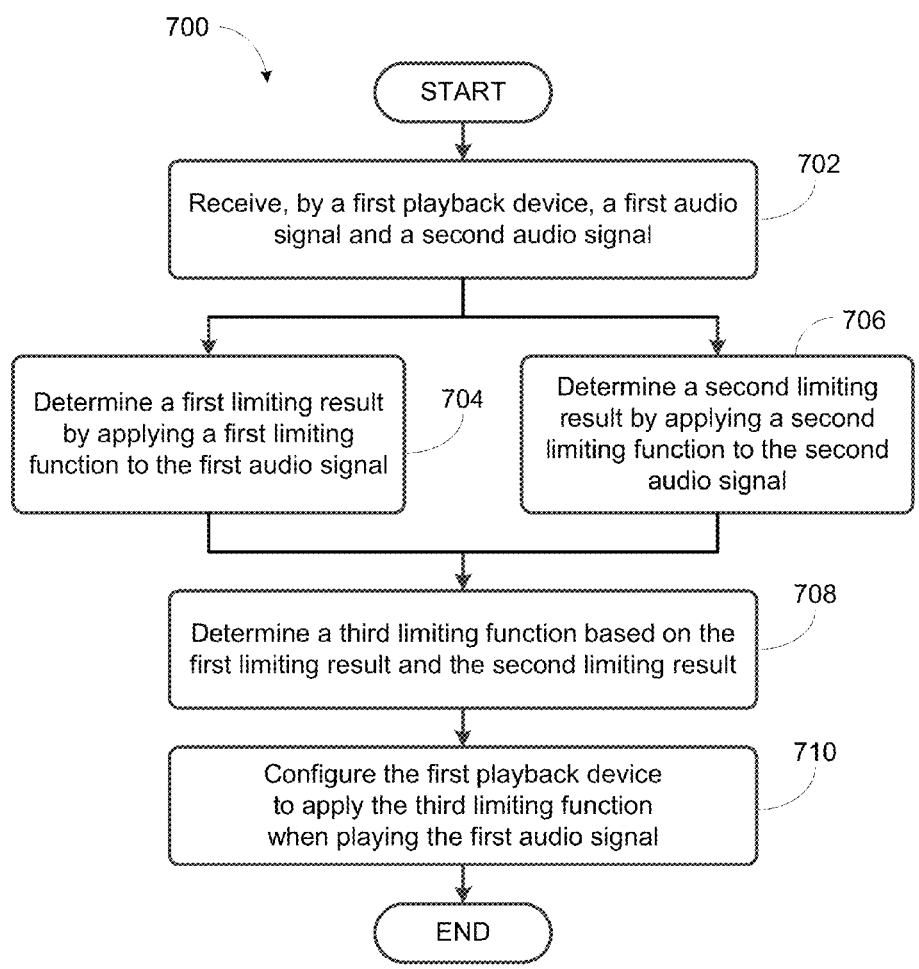
FIG. 7 shows a flow diagram of a second example method for audio output balancing during synchronized playback.

FIG. 7 shows a flow diagram of a second example method 700 for audio output balancing during synchronized playback. Method 700 shown in FIG. 7 presents an embodiment of a method that can be implemented within an operating environment involving, for example, the media playback system 100 of FIG. 1, one or more of the playback device 200 of FIG. 2, and one or more of the control device 300 of FIG. 3. Method 700 may include one or more operations, functions, or actions as illustrated by one or more of blocks 702-710. Although the blocks are illustrated in sequential order, these blocks may also be performed in parallel, and/or in a different order than those described herein. Also, the various blocks may be combined into fewer blocks, divided into additional blocks, and/or removed based upon the desired implementation.

At block 702, the method 700 involves receiving, by a first playback device, a first audio signal and a second audio signal. In one example, as discussed above in connection to the method 500, the first playback device may be configured to play the first audio signal in synchrony with the playback of the second audio signal by a second playback device. Accordingly, in one example, the first and second audio signals may be the audio signals 602 and 604, respectively shown and discussed in connection to FIG. 6A. In one example, the first and second playback devices may be playback devices 104 and 110, respectively shown in FIG. 1. In another example, the first and second audio signals may be the audio signals 608 and 606 respectively shown and discussed in connection to FIG. 6B, and the first and second playback devices may be the playback devices 124 and 122, respectively shown in FIG. 1. Other examples are also possible.

Figure 8A:
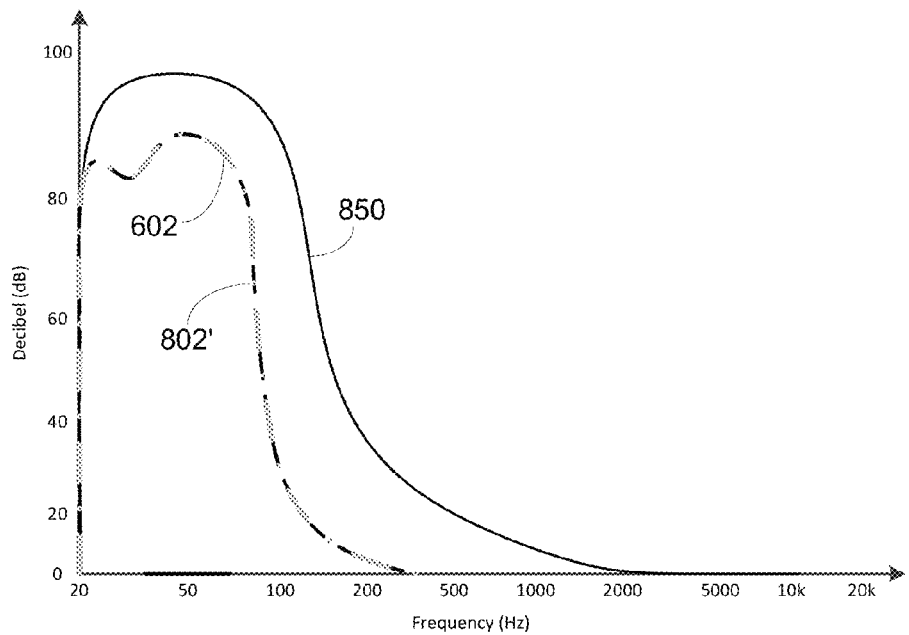
FIGS. 8A, 8B, 8C, and 8D show additional example synchronized playback audio signals, example audio limiters, and example limited audio signals.

At block 704, the method 700 involves the first playback device determining a first limiting result by applying a first limiting function to the first audio signal. In this case, the first limiting function may be one that is associated with the first playback device, and may represent an acoustic limit of the first playback device. FIG. 8A shows an example application of a limiting function 850 to the audio signal 602 introduced previously in connection to the example of FIG. 6A. In this example, the limiting function 850 may be the first limiting function associated with the first playback device, and as discussed in connection to block 702, the audio signal 602 may be the first audio signal to be played by the first playback device. Similar to the relevant discussions in connection to block 504 of the method 500, applying the limiting function 850 to the first audio signal 602 may result in a limited first audio signal 802', which is a model of an audio signal that may be rendered by the first playback device when the first playback device plays the first audio signal 602.

In this example, as shown in FIG. 8A, the limited first audio signal 802' and the first audio signal 602 may be the same because the signal value over the entire frequency range of the first audio signal 602 is within the acoustic limit of the first playback device as defined by the limiting function 850. As such, the first limiting result determined by applying the first limiting function 850 to the first audio signal 602 may indicate that no scaling or reduction in gain to the first audio signal 602 is necessary for the first playback device to properly play the first audio signal 602.

Figure 8B:
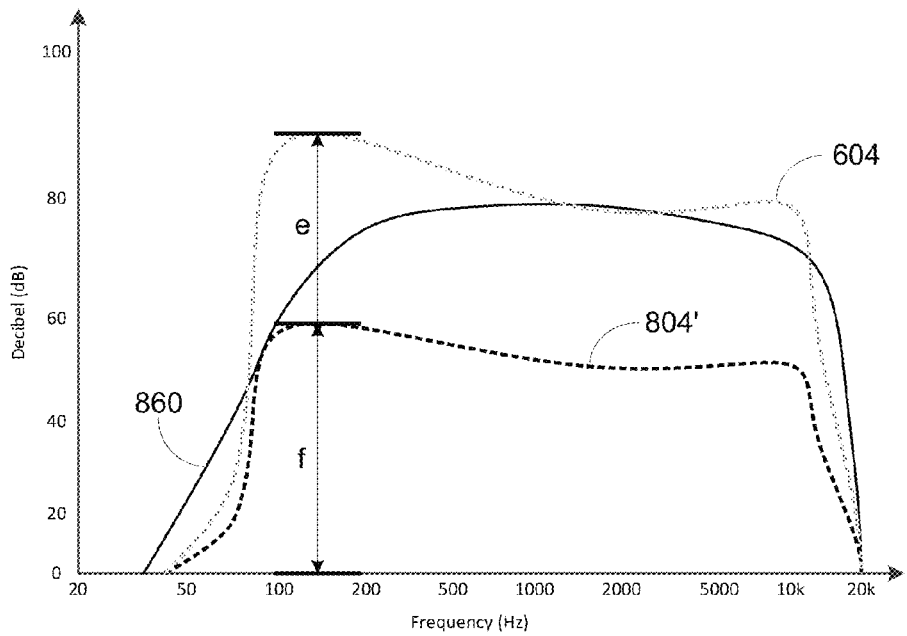

At block 706, the method 700 involves the first playback device determining a second limiting result by applying a second limiting function to the second audio signal. The second limiting function in this example may be associated with the second playback device. As such, block 706 may be similar to block 504 of the method 500, and any discussions above in connection to block 504 may apply to block 706 as well. For instance, the first playback device may be configured to receive the second limiting function prior to determining the second limiting result. FIG. 8B shows an example application of a limiting function 860 to the audio signal 604 discussed previously in connection to the example of FIG. 6A. In this example, the limiting function 860 may be the second limiting function associated with the second playback device, and as discussed in connection to block 702, the audio signal 604 may be the second audio signal to be played by the second playback device. Applying the limiting function 860 to the second audio signal 604 may result in a limited second audio signal 804', which is a model of an audio signal that may be rendered by the second playback device when the second playback device plays the second audio signal 604.

In this example, as shown in FIG. 8B, the limited second audio signal 804' is a proportionally scaled down version of the second audio signal 604 such that the limited second audio signal 804' is within the acoustic limit of the second playback device as defined by the limiting function 860. As shown in this illustrative example, the first limiting result may indicate that the limited second audio signal 804' is the second audio signal 604 scaled down by a ratio of f/(e+f).

At block 708, the method 700 involves the first playback device determining a third limiting function based on the first limiting result and the second limiting result. Similar to that discussed in connection to block 506 of the method 500, one of the first and second audio signals may be limited or proportionally scaled to match the limited result of the other for a balanced output between the playback of the first and second audio signals.

Figure 8C:
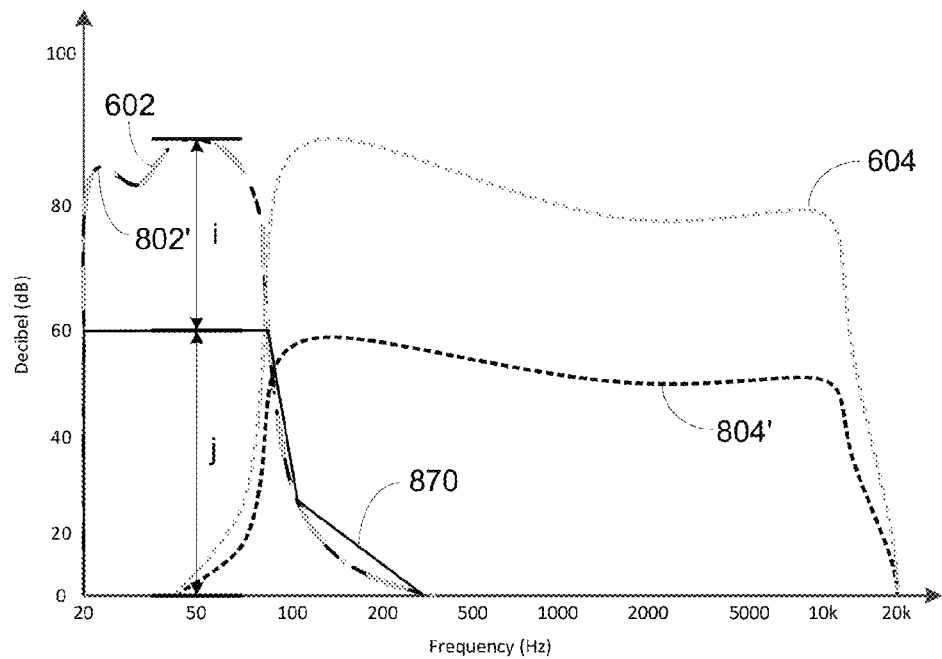

FIG. 8C shows each of the first audio signal 602, the limited first audio signal 802', the second audio signal 604, and the limited second audio signal 804'. As discussed above, and as shown, applying the second limiting function 860 to the second audio signal 604 resulted in a limited second audio signal 804' that was more limited than the limited first audio signal 802' that resulted from applying the first limiting function 850 to the first audio signal 602. Based on the first and second limiting results represented by the limited first audio signal 802' and the limited second audio signal 804', respectively, a third limiting function 870 may be determined such that an application of the third limiting function 870 to the first audio signal 602 results in a balanced output between playback of the first audio signal 602 by the first playback device and playback of the second audio signal 604 by the second playback device. As shown, the limiting function 870, when applied, may be configured to scale the first audio signal 602 by a ratio of j/(i+j) such that j/(i+j)=f/(e+f).

Figure 8D:
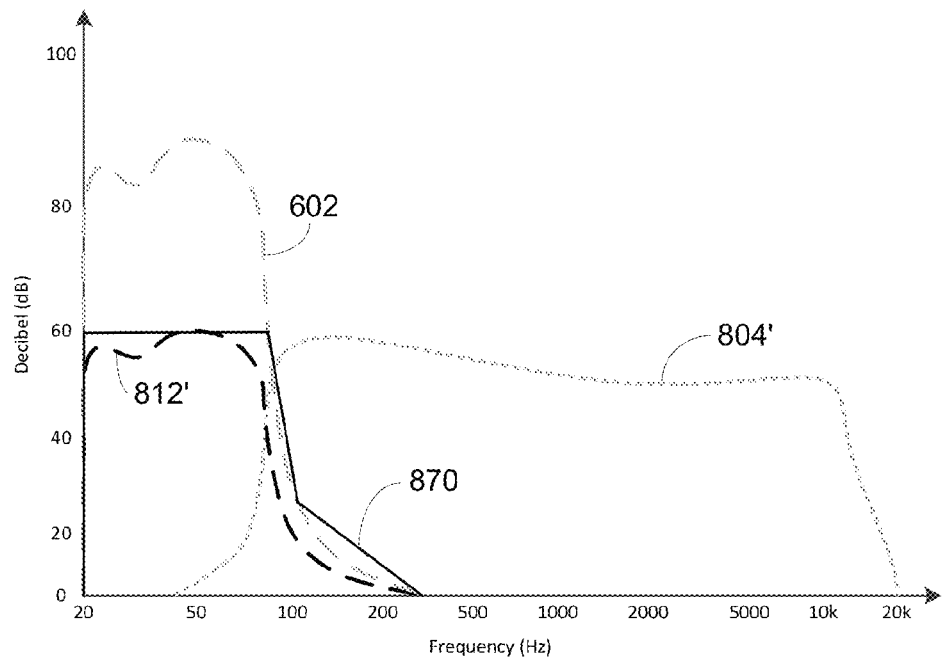

At block 710, the method 700 involves configuring the first playback device to apply the third limiting function when playing the first audio signal. Referring to FIG. 8D, the first playback device may be configured to apply the limiting function 870 to the first audio signal 602 when playing the first audio signal. In one example as shown, application of the third limiting function 870 to the first audio signal 802 may result in a limited first audio signal 812' such that the limited first audio signal 812' is proportionally scaled down from the first audio signal 602 by the ratio of j/(i+j). As discussed above in connection to block 508 of method 500, applying the limiting function 870 to the first audio signal 602 may involve adjusting an amplifier gain applied to the first audio signal 602 by the first playback device. In one case, the amplifier gain may be adjusted to be j/(i+j) of unity gain. As also shown in FIG. 8D, the limited first audio signal 812' and the limited second audio signal 804' are substantially as proportionally balanced as the first audio signal 602 and second audio signal 604 shown in FIG. 6A. In one case, when configured to apply the third limiting function 670, the first playback device may effectively render the limited first audio signal 612' when playing the first audio signal 608. In another example, applying the third limiting function 870 to the first audio signal 802 may involve simply capping or clipping the first audio signal 602 according to the third limiting function 870, rather than proportionally scaling the first audio signal 602.

Synchronous playback of the first audio signal 802 with playback of the second audio signal 604 by the second playback device may be similar to the synchronous playback of the first audio signal 608 by the first playback device and the second audio signal 606 by the second playback device discussed previously in connection to the method 500 of FIG. 5. Along those lines, any previous discussions related to synchronous playback of audio content by two or more playback devices may also be applicable to method 700 and examples discussed in connection to the method 700. Further, while discussions above relating to the method 700 are generally directed to the balancing of audio output during synchronized playback by a consolidated player, one having ordinary skill in the art will appreciate that method 700 may be applied to other synchronized playback scenarios as well.

In addition, note that in some embodiments, the illustrative examples discussed in connection to the method 700 and FIG. 8A-8D represent only one instance of a dynamic balancing of audio output during synchronized playback. In other words, method 700 may be performed for each data packet or series of data packets containing audio signals received as part of a streaming audio content.

c. Third Example Method for Audio Output Balancing During Synchronized Playback

In the illustrative examples discussed above in connection to FIGS. 5 and 7, determining a limiting function to be applied to the first audio signal may generally be based on the acoustic limit of a playback device in the stereo pair or consolidated player with the lowest acoustic limit. In other words, the limiting function may be determined such that the output of the first playback device when playing the first audio signal is reduced to substantially match the output of the second playback device when playing the second audio signal if the synchronous playback output of the two playback devices is increased beyond the acoustic limit of the second playback device. In the example discussed in connection to the method 700 and as shown in FIG. 8D, the resulting output volume of the rendered audio signal may be around 60 dB, which is over 20 dB less than the output volume of received audio signal of over 80 dB. In some embodiments, depending on the acoustic limits and capabilities of the first and second playback devices, the reduction in output volume may be reduced by dynamically adjusting a crossover frequency according to which the first playback device plays the first audio signal.

Figure 9:
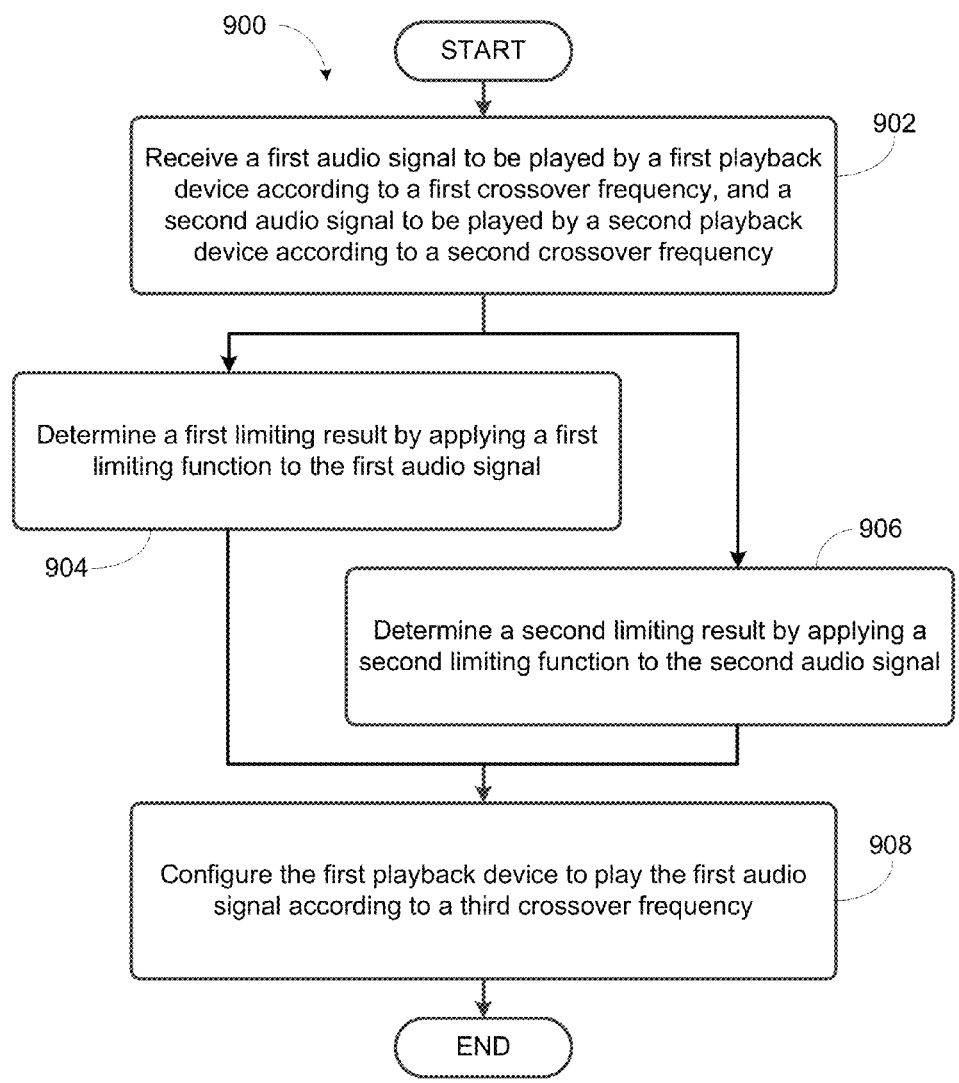
FIG. 9 shows a flow diagram of an example method for adjusting a crossover frequency for audio output balancing during synchronized playback.

FIG. 9 shows a flow diagram of an example method 900 for adjusting a crossover frequency for audio output balancing during synchronized playback. Method 900 shown in FIG. 9 presents an embodiment of a method that can be implemented within an operating environment involving, for example, the media playback system 100 of FIG. 1, one or more of the playback device 200 of FIG. 2, and one or more of the control device 300 of FIG. 3. Method 700 may include one or more operations, functions, or actions as illustrated by one or more of blocks 902-908. Although the blocks are illustrated in sequential order, these blocks may also be performed in parallel, and/or in a different order than those described herein. Also, the various blocks may be combined into fewer blocks, divided into additional blocks, and/or removed based upon the desired implementation.

At block 902, the method 900 involves receiving a first audio signal to be played by a first playback device according to a first crossover frequency, and a second audio signal to be played by a second playback device according to a second crossover frequency. Continuing with the examples above, the first audio signal may be the audio signal 602 shown in FIG. 6A and the first crossover frequency may be the crossover frequency 610 of 80 Hz. Analogously, the second audio signal may be the audio signal 604 and the second crossover frequency may also be the crossover frequency 610 of 80 Hz. As indicated previously, in some cases, the first audio signal 602 and the second audio signal 604 may be different components of an audio content.

In some embodiments, the first audio signal 602 and the second audio signal 604 may be received individually, while in some other embodiments, audio content including both the first audio signal 602 and the second audio signal 604 may be received as a whole, and band-pass filters may be applied to the received audio content to generate the first audio signal 602 and the second audio signal 604. In some cases, the first and second crossover frequencies (in this example, both may be the crossover frequency 610) may be received along with the audio content to generate and apply applicable band-pass filters. In some other cases, the first and second crossover frequencies may be predetermined when the first and second playback devices were configured as a consolidated player based on playback capabilities and configurations of the first and second playback devices. Block 902 may be similar to block 702 discussed above in connection to FIG. 7. Accordingly, any relevant discussions in connection to the method 700 of FIG. 7 may be applicable to block 902 as well.

Figure 10A:
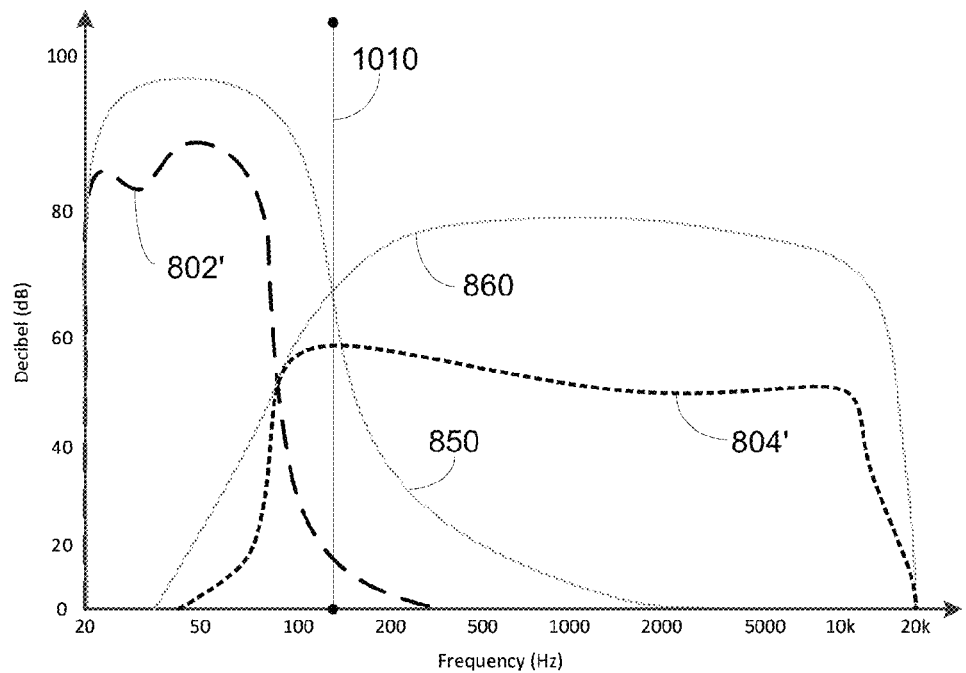
FIGS. 10A, 10B, 10C, 10D, 10E, and 10F show further example synchronized playback audio signals, example audio limiters, and example limited audio signals.

At block 904, the method 900 involves determining a first limiting result by applying a first limiting function to the first audio signal, and at block 906, the method 900 involves determining a second limiting result by applying a second limiting function to the second audio signal. Similar to blocks 704 and 706, respectively, and continuing with the above examples, the first limiting function may be the limiting function 850 that is associated with the first playback device, and the second limiting function may be the limiting function 860 that is associated with the second playback device, shown previously in FIGS. 8A and 8B, respectively. As shown in FIG. 10A, the first limiting result determined from applying the first limiting function 850 to the first audio signal 602 may include the limited first audio signal 802', and the second limiting result determined from applying the second limiting function 860 to the second audio signal 604 may include the limited second audio signal 804'. As blocks 904 and 906 are similar to blocks 704 and 706, respectively, any relevant discussions in connection to the method 700 of FIG. 6 may be application to blocks 904 and 906 as well.

At block 908, the method 900 involves configuring the first playback device to play the first audio signal according to a third crossover frequency. Configuring the first playback device to play the first audio signal according to the third crossover frequency may involve first determining the third crossover frequency. In one example, the third crossover frequency may be determined based on the first limiting result and the second limiting result. For instance, the third crossover frequency may be determined based on frequencies at which the second playback device is limited, and determining whether the first playback device is capable of playing audio content in those frequencies. In the example shown in FIG. 10A, the example third crossover frequency 1010 may be determined to be the highest frequency at which the first playback device can render audio content of a satisfactory acoustic quality and/or output volume. As suggested above, this may be the case when the second audio signal 604 was more limited by the limiting function 860 towards the lower end of the mid-high frequency range. In this example, the example third crossover frequency 1010 may be 150 Hz.

Figure 10B:
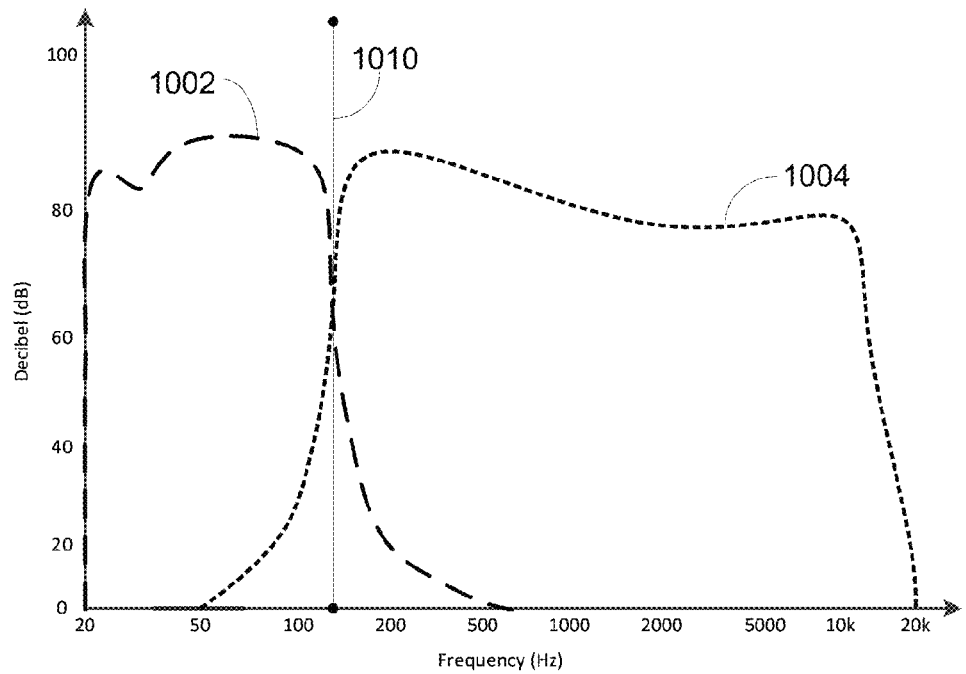

FIG. 10B shows an example first audio signal 1002 that may be played by the first playback device according to the third crossover frequency 1010 of 150 Hz. In this case, audio content including both the first audio signal 602 and the second audio signal 604 may be received by the first playback device. Subsequently, the first playback device may apply band-pass filters to the received audio content according to the third crossover frequency 1010 to generate the first audio signal 1004 to be played by the first playback device. As indicated above, the first playback device may be configured to play the first audio signal 602 in synchrony with playback of the second audio signal 604. As such, the second playback device may be configured to play the second audio signal 604 according to a fourth crossover frequency that may be determined based on the third crossover frequency and/or the first and second limiting results from blocks 904 and 906. FIG. 10B also shows an example second audio signal 1004 that may be played by the second playback device according to the fourth crossover frequency, which in this example may also be 150 Hz, same as the third crossover frequency 1010.

In one example, the first playback device may be configured to send to the second playback device, data indicating the third crossover frequency, and configuring, or causing the second playback device to be configured to play the second audio signal according to the fourth crossover frequency. In this case, the second playback device may be configured to determine the fourth crossover frequency based on the third crossover frequency. In the case the second playback device receives the audio content including both the first audio signal 602 and the second audio signal 604, the second playback device may be configured to apply band-pass filters according to the fourth crossover frequency to generate the second audio signal 1004 to be played by the second playback device. As indicated previously, the fourth crossover frequency may in some cases be the same as the third crossover frequency 1010 of 150 Hz.

In another example, the first playback device may be configured to determine the fourth crossover frequency based on the third crossover frequency, and send to the second playback device, data indicating the fourth crossover frequency. In this case the second playback device may be configured to apply band-pass filters according to the fourth crossover frequency 1010 to generate the second audio signal 1004 to be played without having to determine the fourth crossover frequency itself.

Playback of the first audio signal 1002 by the first playback device in synchrony with playback of the second audio signal 1004 by the second playback device may result in a more balanced output than playback of the first audio signal 602 by the first playback device in synchrony with playback of the second audio signal 604 by the second playback device. In some embodiments, the dynamic adjustment of crossover frequencies may result in sufficient audio output balancing during synchronized playback. In some other embodiments, however, additional steps, such as those described in connection to FIGS. 5 and 7 may be performed to further balance audio output by the first and second playback devices during synchronous playback. For illustration purposes, FIGS. 10C-10E show an example application of the method 700 of FIG. 7 to the first audio signal 1002 and the second audio signal 1004 of FIG. 10B.

Figure 10C:
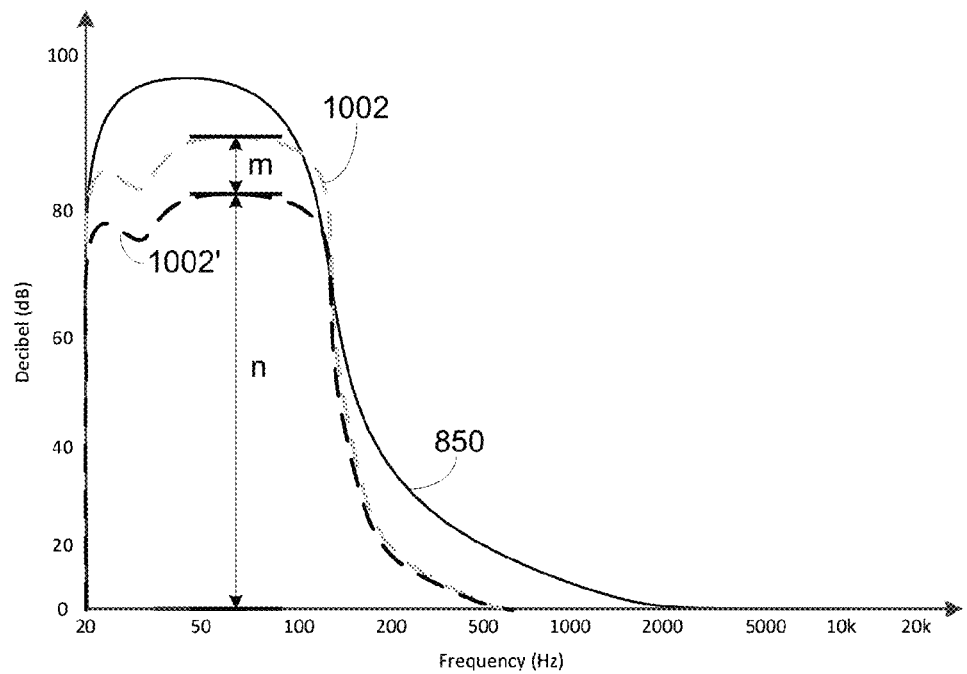
Figure 10D:
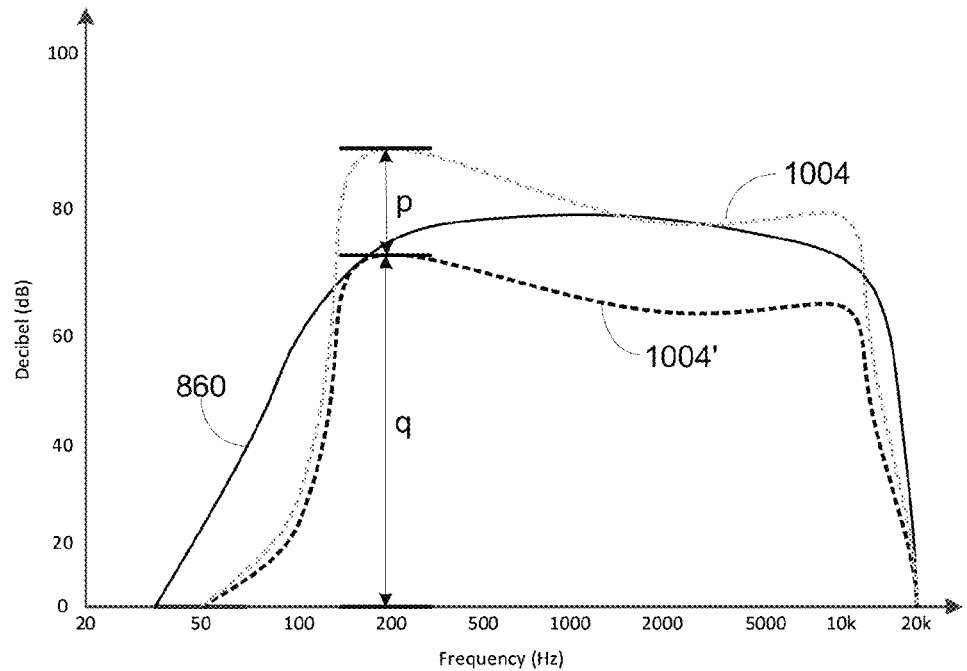

As shown in FIG. 10C, the first limiting function 850 may be applied to the first audio signal 1002. In this example, the limiting result may indicate that a limited first audio signal 1002' generated from applying the first limiting function 850 to the first audio signal 1002 is the first audio signal 1002 scaled down by a ratio of n/(m+n). As shown in FIG. 10D, the second limiting function 860 may be applied to the second audio signal 1004. In this example, the limiting result may indicate that a limited second audio signal 1004' generated from applying the second limiting function 860 to the second audio signal 1004 is the second audio signal 1004 scaled down by a ratio of q/(p+q).

As indicated previously, one of the first audio signal 1002 and second audio signal 1004 may need to be limited or proportionally scaled to match the limited result of the other for a balanced output between the playback of the first audio signal 1002 by the first playback device and playback of the second audio signal 1004 by the second playback device. Comparing n/(m+n) and q/(p+q) as shown in FIGS. 10C and 10D, applying the second limiting function 860 to the second audio signal 1004 resulted in a limited second audio signal 1004' that was more limited than the limited first audio signal 1002' that results from applying the first limiting function 850 to the first audio signal 1002. In other words q/(p+q) is less than n/(m+n) in this example.

Figure 10E:
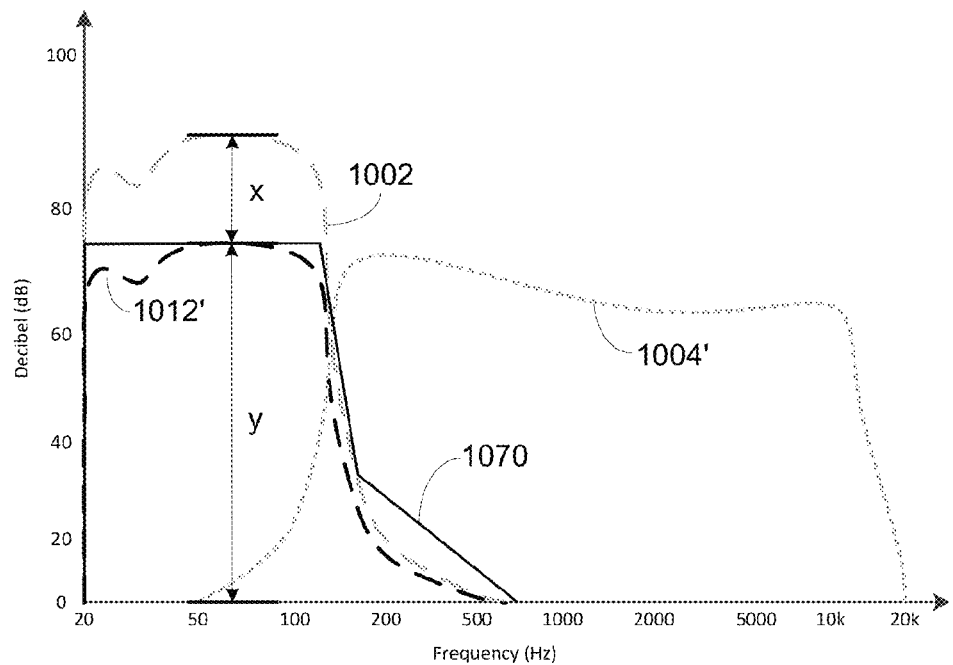

Accordingly, as shown in FIG. 10E, a limiting function 1070 may be determined such that an application of the limiting function 1070 to the first audio signal 1002 results in a balanced output between playback of the first audio signal 1002 by the first playback device and playback of the second audio signal 1004 by the second playback device. As shown, the limiting function 1070, when applied, may be configured to scale the first audio signal 1002 by a ratio of y/(x+y) such that y/(x+y)=q/(p+q).

Figure 10F:
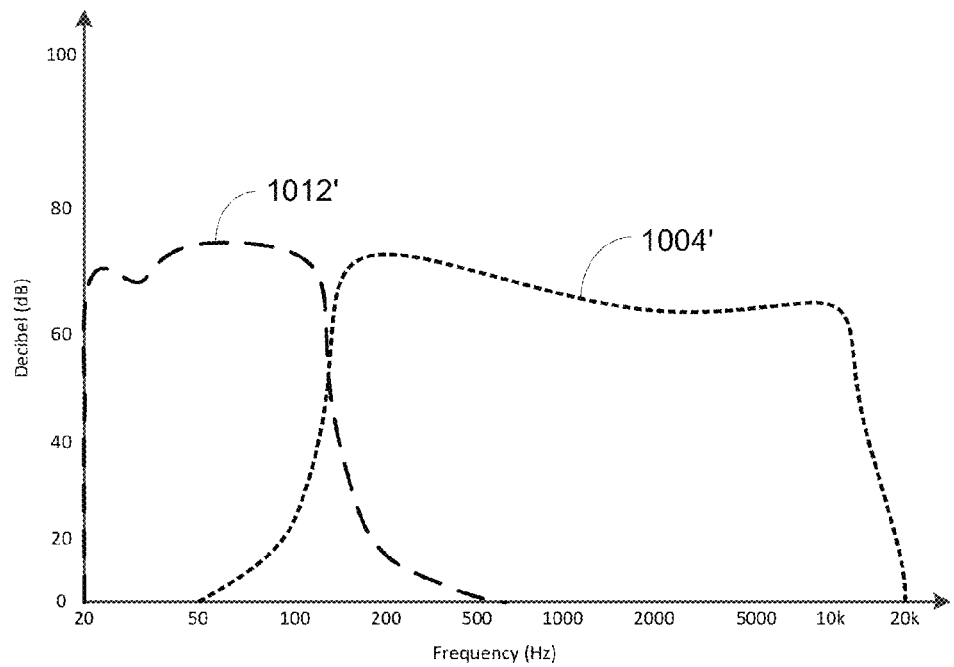

The first playback device may accordingly be configured to apply the limiting function 1070 when playing the first audio signal 1002. As shown, a limited first audio signal 1012' generated when applying the limiting function 1070 to the first audio signal 1002 is proportionally scaled down from the first audio signal 1002 by the ratio of y/(x+y). As indicated previously, applying the limiting function 1070 to the first audio signal 1002 may involve adjusting an amplifier gain applied to the first audio signal 1002 by the first playback device. As shown in FIG. 10F, the limited first audio signal 1012' and the limited second audio signal 1004' are substantially as proportionally balanced as the first audio signal 602 and second audio signal 602 shown in FIG. 6A. As indicated previously, in some cases, applying the limiting function 1070 to the first audio signal 1002 may involve simply capping or clipping the first audio signal 1002 according to the limiting function 1070, rather than proportionally scaling the first audio signal 1002.

When compared to the limited first and second audio signals 812' and 804' shown in FIG. 8D, the limited modified first and second audio signals 1012' and 1004', as shown in FIG. 10F may be rendered at a balanced output volume of over 70 dB, which is less reduced from the output volume of 80 dB of the first and second audio signals 602 and 604 than the balanced output volume of around 60 dB if rendering the limited first and second audio signals 812' and 804'.

While discussions above relating to the method 900 are generally directed to the balancing of audio output during synchronized playback by a consolidated player, one having ordinary skill in the art will appreciate that method 900 may be applied to other synchronized playback scenarios as well. In addition, note that in some embodiments, the illustrative examples discussed in connection to the method 900 and FIG. 10A-10F represent only one instance of a dynamic balancing of audio output during synchronized playback. In other words, method 900 may be performed for each data packet or series of data packets containing audio signals received as part of a streaming audio content. Other examples are also possible.

IV. Conclusion

The description above discloses, among other things, various example systems, methods, apparatus, and articles of manufacture including, among other components, firmware and/or software executed on hardware. It is understood that such examples are merely illustrative and should not be considered as limiting. For example, it is contemplated that any or all of the firmware, hardware, and/or software aspects or components can be embodied exclusively in hardware, exclusively in software, exclusively in firmware, or in any combination of hardware, software, and/or firmware. Accordingly, the examples provided are not the only way(s) to implement such systems, methods, apparatus, and/or articles of manufacture.

As indicated above, the present application involves balancing of outputs from playback devices playing audio content in synchrony. In one aspect, a first playback device is provided. The first playback device includes a processor, and memory having stored thereon instructions executable by the processor to cause the first playback device to perform functions. The functions include receiving a first audio signal. The first playback device is configured to play the first audio signal according to a first crossover frequency. The functions also include determining a first limiting result by applying a limiting function to a second audio signal. The second audio signal is configured for playback by a second playback device according to a second crossover frequency, and the limiting function is associated with the second playback device. The functions further include, based on the first limiting result, configuring the first playback device to play the first audio signal according to a third crossover frequency.

In another aspect, a method is provided. The method involves receiving, by a first playback device, audio content comprising a first audio signal and a second audio signal. The first playback device is configured to play the first audio signal according to a first crossover frequency in synchrony with the playback of the second audio signal according to a second crossover frequency by a second playback device. The method also involves determining a first limiting result by applying, by the first playback device, a first limiting function to the first audio signal. The first limiting function is associated with the first playback device. The method further involves determining a second limiting result by applying, by the first playback device, a second limiting function to the second audio signal. The second limiting function is associated with the second playback device. The method also involves, based on the first limiting result and the second limiting result, configuring the first playback device to play the first audio signal according to a third crossover frequency.

In yet another aspect, a non-transitory computer readable memory is provided. The non-transitory computer readable memory has stored thereon instructions executable by a computing device to cause the computing device to perform functions. The functions include receiving a first audio signal. The first playback device is configured to play the first audio signal according to a first crossover frequency. The functions also include determining a first limiting result by applying a limiting function to a second audio signal. The second audio signal is configured for playback by a second playback device according to a second crossover frequency, and the limiting function is associated with the second playback device. The functions further include, based on the first limiting result, configuring the first playback device to play the first audio signal according to a third crossover frequency.

Additionally, references herein to "embodiment" means that a particular feature, structure, or characteristic described in connection with the embodiment can be included in at least one example embodiment of an invention. The appearances of this phrase in various places in the specification are not necessarily all referring to the same embodiment, nor are separate or alternative embodiments mutually exclusive of other embodiments. As such, the embodiments described herein, explicitly and implicitly understood by one skilled in the art, can be combined with other embodiments.

The specification is presented largely in terms of illustrative environments, systems, procedures, steps, logic blocks, processing, and other symbolic representations that directly or indirectly resemble the operations of data processing devices coupled to networks. These process descriptions and representations are typically used by those skilled in the art to most effectively convey the substance of their work to others skilled in the art. Numerous specific details are set forth to provide a thorough understanding of the present disclosure. However, it is understood to those skilled in the art that certain embodiments of the present disclosure can be practiced without certain, specific details. In other instances, well known methods, procedures, components, and circuitry have not been described in detail to avoid unnecessarily obscuring aspects of the embodiments. Accordingly, the scope of the present disclosure is defined by the appended claims rather than the forgoing description of embodiments.

When any of the appended claims are read to cover a purely software and/or firmware implementation, at least one of the elements in at least one example is hereby expressly defined to include a tangible, non-transitory medium such as a memory, DVD, CD, Blu-ray, and so on, storing the software and/or firmware.

We claim:

1. A first playback device comprising:
one or more processors; and
computer-readable memory having stored thereon instructions that, when executed by the one or more processors, cause the first playback device to perform functions comprising:
receiving audio content to be played back by the first playback device and a second playback device in synchrony, wherein the audio content comprises a first stereo component to be played by the first playback device and a second stereo component to be played by the second playback device in synchrony with playback of the first stereo component by the first playback device;
determining a limiting result that represents playback of the second stereo component of the audio content by applying to the second stereo component of the audio content, a pre-determined volume-limiting function that is associated with the second playback device, wherein the limiting result indicates frequencies at which a playback volume of the second playback device is limited;
determining a crossover frequency based on the indicated frequencies at which the playback volume of the second playback device is limited;
causing the second playback device to play a first portion of the second stereo component of the audio content that is above the determined crossover frequency; and
playing (i) the first stereo component of the audio content and (ii) a second portion of the second stereo component of the audio content that is below the indicated frequency in synchrony with playback of the first portion of the second stereo component by the second playback device.

2. The first playback device of claim 1, wherein the first playback device has greater output audio frequency range than the first playback device.

3. The first playback device of claim 1, wherein the functions further comprise:
prior to receiving the audio content, receiving a command to form a bonded zone with the second playback device.

4. The first playback device of claim 1, wherein the functions further comprise:
identifying, in memory storage, the pre-determined volume-limiting function that is associated with the second playback device.

5. The first playback device of claim 1, wherein the functions further comprise:
receiving, from the second playback device, the pre-determined volume-limiting function that is associated with the second playback device.

6. The first playback device of claim 1, wherein causing the second playback device to play the first portion of the second stereo component of the audio content that is above the determined crossover frequency comprises:
sending to the second playback device, the first portion of the second stereo component of the audio content.

7. The first playback device of claim 1, wherein causing the second playback device to play the first portion of the second stereo component of the audio content that is above the determined crossover frequency comprises:
sending, to the second playback device, (i) the audio content and (ii) a command to play the first portion of the second stereo component of the audio content.

8. The first playback device of claim 1, wherein causing the second playback device to play the first portion of the second stereo component of the audio content that is above the determined crossover frequency comprises:
sending, to the second playback device, (i) the second stereo component of the audio content and (ii) a command to play the first portion of the second stereo component.

9. The first playback device of claim 1, wherein the determined crossover frequency is around 80 Hz.

10. Tangible, non-transitory computer-readable memory having stored thereon instructions that, when executed by one or more processors of a first playback device, cause the first playback device to perform functions comprising:
receiving audio content to be played back by the first playback device and a second playback device in synchrony, wherein the audio content comprises a first stereo component to be played by the first playback device and a second stereo component to be played by the second playback device in synchrony with playback of the first stereo component by the first playback device;
determining a limiting result that represents playback of the second stereo component of the audio content by applying to the second stereo component of the audio content, a pre-determined volume-limiting function that is associated with the second playback device, wherein the limiting result indicates frequencies at which a playback volume of the second playback device is limited;

determining a crossover frequency based on the indicated frequencies at which the playback volume of the second playback device is limited;

causing the second playback device to play a first portion of the second stereo component of the audio content that is above the determined crossover frequency; and playing (i) the first stereo component of the audio content and (ii) a second portion of the second stereo component of the audio content that is below the indicated frequency in synchrony with playback of the first portion of the second stereo component by the second playback device.

11. The tangible, non-transitory computer-readable memory of claim 10, wherein the first playback device has greater output audio frequency range than the first playback device.

12. The tangible, non-transitory computer-readable memory of claim 10, wherein the functions further comprise:
prior to receiving the audio content, receiving a command to form a bonded zone with the second playback device.

13. The tangible, non-transitory computer-readable memory of claim 10, wherein the functions further comprise:
identifying, in memory storage, the pre-determined volume-limiting function that is associated with the second playback device.

14. The tangible, non-transitory computer-readable memory of claim 10, wherein the functions further comprise:
receiving, from the second playback device, the pre-determined volume-limiting function that is associated with the second playback device.

15. The tangible, non-transitory computer-readable memory of claim 10, wherein the determined crossover frequency is around 80 Hz.

16. A method comprising:
receiving, via a first playback device, audio content to be played back by the first playback device and a second playback device in synchrony, wherein the audio content comprises a first stereo component to be played by the first playback device and a second stereo component to be played by the second playback device in synchrony with playback of the first stereo component by the first playback device;

determining, via the first playback device, a limiting result that represents playback of the second stereo component of the audio content by applying to the second stereo component of the audio content, a pre-determined volume-limiting function that is associated with the second playback device, wherein the limiting result indicates frequencies at which a playback volume of the second playback device is limited;

determining, via the first playback device, a crossover frequency based on the indicated frequencies at which the playback volume of the second playback device is limited;

causing, via the first playback device, the second playback device to play a first portion of the second stereo component of the audio content that is above the determined crossover frequency; and playing, via the first playback device (i) the first stereo component of the audio content and (ii) a second portion of the second stereo component of the audio content that is below the indicated frequency in synchrony with playback of the first portion of the second stereo component by the second playback device.

17. The method of claim 16, wherein the first playback device has greater output audio frequency range than the first playback device.

18. The method of claim 16, wherein causing the second playback device to play the first portion of the second stereo component of the audio content that is above the determined crossover frequency comprises:
sending, via the first playback device to the second playback device, the first portion of the second stereo component of the audio content.

19. The method of claim 16, wherein causing the second playback device to play the first portion of the second stereo component of the audio content that is above the determined crossover frequency comprises:
sending, via the first playback device to the second playback device, (i) the audio content and (ii) a command to play the first portion of the second stereo component of the audio content.

20. The method of claim 16, wherein causing the second playback device to play the first portion of the second stereo component of the audio content that is above the determined crossover frequency comprises sending, via the first playback device to the second playback device, (i) the second stereo component of the audio content and (ii) a command to play the first portion of the second stereo component.

* * * * *